(12) United States Patent
Konuma et al.

(10) Patent No.: US 7,732,824 B2
(45) Date of Patent: *Jun. 8, 2010

(54) SELF-LIGHT-EMITTING DEVICE AND METHOD OF MANUFACTURING THE SAME

(75) Inventors: Toshimitsu Konuma, Kanagawa (JP); Junya Maruyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 131 days.

This patent is subject to a terminal disclaimer.

(21) Appl. No.: 11/592,575

(22) Filed: Nov. 3, 2006

(65) Prior Publication Data

US 2007/0051959 A1 Mar. 8, 2007

Related U.S. Application Data

(63) Continuation of application No. 10/929,896, filed on Aug. 30, 2004, now Pat. No. 7,132,693, which is a continuation of application No. 09/782,239, filed on Feb. 13, 2001, now Pat. No. 6,833,560.

(30) Foreign Application Priority Data

Feb. 22, 2000 (JP) ............................. 2000-045256

(51) Int. Cl.
*H01L 27/15* (2006.01)
(52) U.S. Cl. .......................................... 257/83; 257/54
(58) Field of Classification Search .................... 257/83
See application file for complete search history.

(56) References Cited

U.S. PATENT DOCUMENTS

| 4,792,500 | A | 12/1988 | Kojima |
| 4,800,202 | A | 1/1989 | Weissmüller et al. |
| 5,117,299 | A | 5/1992 | Kondo et al. |
| 5,132,676 | A | 7/1992 | Kimura et al. |
| 5,240,801 | A | 8/1993 | Hayashi et al. |
| 5,247,190 | A | 9/1993 | Friend et al. |

(Continued)

FOREIGN PATENT DOCUMENTS

EP 0 278 352 A2 8/1988

(Continued)

OTHER PUBLICATIONS

European Search Report re application No. EP 03 02 0964.7, mailed Dec. 3, 2003.

(Continued)

*Primary Examiner*—Wai-Sing Louie
*Assistant Examiner*—Bilkis Jahan
(74) *Attorney, Agent, or Firm*—Husch Blackwell Sanders LLP

(57) ABSTRACT

Failure light emission of an EL element due to failure film formation of an organic EL material in an electrode hole 46 is improved. By forming the organic EL material after embedding an insulator in an electrode hole 46 on a pixel electrode and forming a protective portion 41b, failure film formation in the electrode hole 46 can be prevented. This can prevent concentration of electric current due to a short circuit between a cathode and an anode of the EL element, and can prevent failure light emission of an EL layer.

48 Claims, 15 Drawing Sheets

U.S. PATENT DOCUMENTS

| | | | |
|---|---|---|---|
| 5,330,616 | A | 7/1994 | Yamazaki |
| 5,399,502 | A | 3/1995 | Friend et al. |
| 5,412,493 | A | 5/1995 | Kunii et al. |
| 5,430,320 | A | 7/1995 | Lee |
| 5,453,858 | A | 9/1995 | Yamazaki |
| 5,500,750 | A | 3/1996 | Kanbe et al. |
| 5,550,066 | A | 8/1996 | Tang et al. |
| 5,583,369 | A | 12/1996 | Yamazaki et al. |
| 5,592,318 | A * | 1/1997 | Majima et al. .............. 349/122 |
| 5,684,365 | A | 11/1997 | Tang et al. |
| 5,706,064 | A | 1/1998 | Fukunaga et al. |
| 5,706,067 | A | 1/1998 | Colgan et al. |
| 5,739,890 | A | 4/1998 | Uda et al. |
| 5,767,541 | A | 6/1998 | Hanagasaki |
| 5,767,827 | A | 6/1998 | Kobayashi et al. |
| 5,877,832 | A | 3/1999 | Shimada |
| 5,895,228 | A | 4/1999 | Biebuyck et al. |
| 5,907,376 | A | 5/1999 | Shimada et al. |
| 5,910,271 | A | 6/1999 | Ohe et al. |
| 5,917,571 | A | 6/1999 | Shimada |
| 5,933,204 | A | 8/1999 | Fukumoto |
| 5,946,561 | A | 8/1999 | Yamazaki et al. |
| 5,949,107 | A | 9/1999 | Zhang |
| 5,976,698 | A | 11/1999 | Staral et al. |
| 5,998,805 | A | 12/1999 | Shi et al. |
| 6,008,876 | A | 12/1999 | Moore |
| 6,037,197 | A | 3/2000 | Yamazaki et al. |
| 6,046,547 | A * | 4/2000 | Nishio et al. .............. 315/169.3 |
| 6,049,132 | A | 4/2000 | Iwahashi et al. |
| 6,114,715 | A | 9/2000 | Hamada |
| 6,191,183 | B1 | 2/2001 | Kobayashi et al. |
| 6,246,179 | B1 | 6/2001 | Yamada |
| 6,452,341 | B1 | 9/2002 | Yamauchi et al. |
| 6,466,279 | B1 * | 10/2002 | Nakata ........................ 349/42 |
| 6,618,029 | B1 | 9/2003 | Ozawa |
| 6,638,781 | B1 | 10/2003 | Hirakata et al. |
| 6,674,495 | B1 * | 1/2004 | Hong et al. .................... 349/43 |
| 6,759,677 | B1 | 7/2004 | Yamazaki et al. |
| 6,768,257 | B1 * | 7/2004 | Yamada et al. .............. 313/504 |
| 6,833,560 | B2 | 12/2004 | Konuma et al. |
| 7,118,994 | B2 | 10/2006 | Yamazaki et al. |
| 7,132,693 | B2 * | 11/2006 | Konuma et al. ................ 257/83 |
| 7,288,420 | B1 | 10/2007 | Yamazaki et al. |
| 2001/0020922 | A1 | 9/2001 | Yamazaki et al. |
| 2002/0000613 | A1 | 1/2002 | Ohtani et al. |
| 2007/0010075 | A1 | 1/2007 | Yamazaki et al. |

FOREIGN PATENT DOCUMENTS

| | | |
|---|---|---|
| EP | 0 717 439 A2 | 6/1996 |
| EP | 0 768 352 | 4/1997 |
| EP | 0 881 668 A2 | 12/1998 |
| EP | 0 893 485 | 1/1999 |
| EP | 0 899 987 | 3/1999 |
| EP | 1 058 314 A2 | 12/2000 |
| EP | 1 058 484 A | 12/2000 |
| EP | 1 063 704 A2 | 12/2000 |
| EP | 1 117 085 A2 | 7/2001 |
| JP | 10-214043 | 8/1988 |
| JP | 07-258410 | 10/1995 |
| JP | 10-092576 | 4/1998 |
| JP | 10-189252 | 7/1998 |
| JP | 10-214043 | 8/1998 |
| JP | 11-251600 | 9/1999 |
| WO | WO 90/13148 | 11/1990 |

OTHER PUBLICATIONS

Fritsch, U. et al, "A Submicron CMOS Two Level Metal Process with Planarization Techniques," V-MIC Conf., Jun. 13-14, 1998, IEEE, 1998, pp. 69-75.

Ibaraki, N. et al, "A New a-Si TFT with SiO2/SiNx Gate Insulator for 10.4 inch LCDs," Proceedings of the International Display Research Conference, IEEE, 1991, pp. 97-100.

Pramanik, D. et al, "A High Reliability Triple Metal Process for High Performance Application Specific Circuits," VLSI Multilevel Interconnection Conference, Jun. 11-12, 1991, pp. 27-33.

Wolf, S., *Silicon Processing for the VLSI Era,* vol. 2, Lattice Press, Sunset Beach, CA, 1990, pp. 201-204.

Tsutsui, T. et al, "Electroluminescence in Organic Thin Films," Photochemical Processes in Organized Molecular Systems, 1991, pp. 437-450.

Baldo, M.A. et al, "Highly Efficient Phosphorescent Emission from Organic Electroluminescent Devices," Nature, Sep. 10, 1998, vol. 395, pp. 151-154.

Baldo, M.A. et al, "Very High-Efficiency Green Organic Light-Emitting Devices Based on Electrophosphorescence," Applied Physics Letters, Jul. 5, 1999, vol. 75, No. 1, pp. 4-6.

Schenk, H. et al, "Polymers for Light Emitting Diodes," EuroDisplay '99, Proceedings of the 19th International Display Research Conference, Berlin, Germany, Sep. 6-9, 1999, pp. 33-37.

Tsutsui, T. et al, "High Quantum Efficiency in Organic Light-Emitting Devices with Iridium-Complex as a Triplet Emissive Center," Japanese Journal of Applied Physics, Dec. 15, 1999, vol. 38, part 2, No. 12B, pp. L1502-L1504.

Rajeswaran, G., "OLED Manufacturing Technology," Seminar M-7, Society for Information Display, Seminar Lecture Notes, vol. 1, Baltimore, MD, May 19 and May 23, 2003.

European Search Report re Application No. EP 01 10 4296.7, mailed May 30, 2001.

Ibaraki, N. et al, "A New a-Si TFT with SiO2/SiNx Gate Insulator for 10.4 inch LCDs," Conference Record of the 1991 IDRC (International Display Research Conference), 1991, pp. 97-100.

Pramanik, D. et al, "A High Reliability Triple Metal Process for High Performance Application Specific Circuits," VMIC Conference (Proceedings, 8th International VLSI Multilevel Interconnection Conference), 1991, pp. 27-33.

Schenk, H. et al, "Polymers for Light Emitting Diodes," EuroDisplay '99: Proceedings of the 19th IDRC (International Display Research Conference Proceedings), Sep. 6, 1999, pp. 33-37.

Rajeswaran, G., "OLED Manufacturing Technology," Seminar Lecture Notes—Society for Information Display, vol. 1, May 19, 2003, pp. M-7/55, M-7/57.

Chinese Office Action re application No. CN 200510084815.3, dated Feb. 22, 2008 (with English translation).

Chinese Office Action re application No. CN 200610101609.3, dated Mar. 28, 2008 (with English translation).

\* cited by examiner

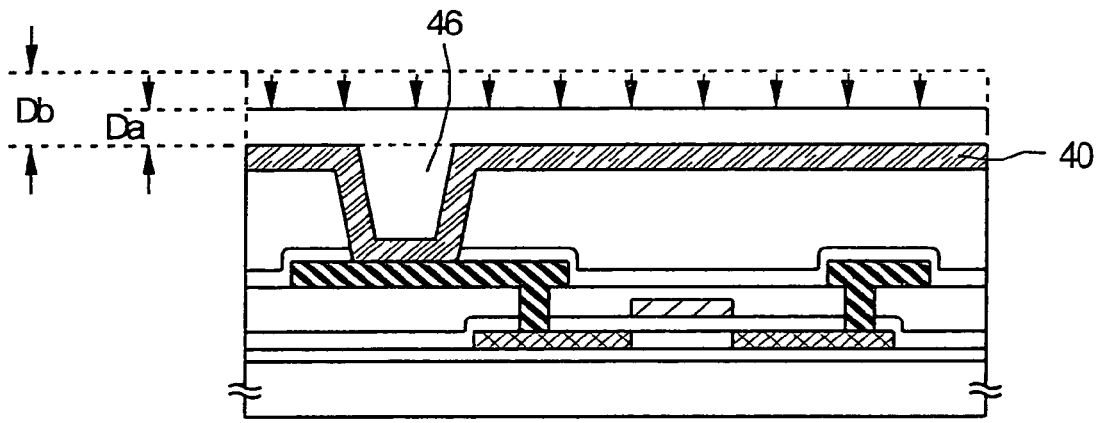
FIG. 5A
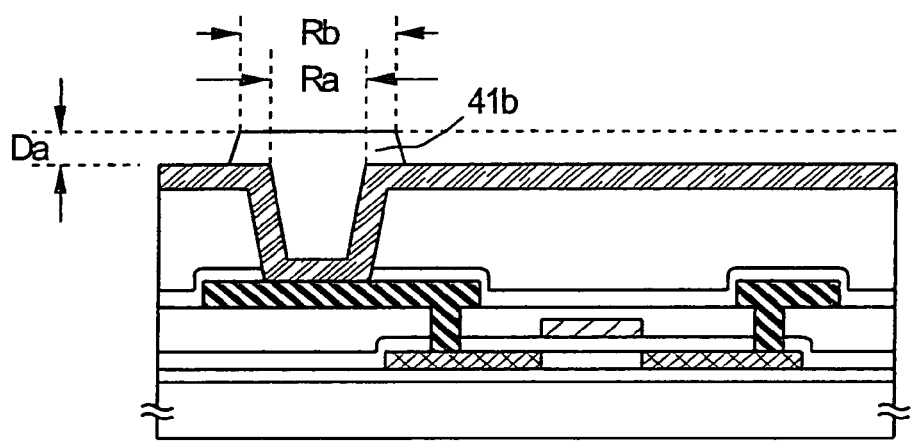
FIG. 5B
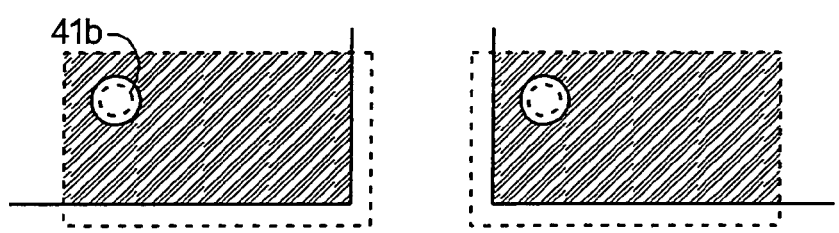
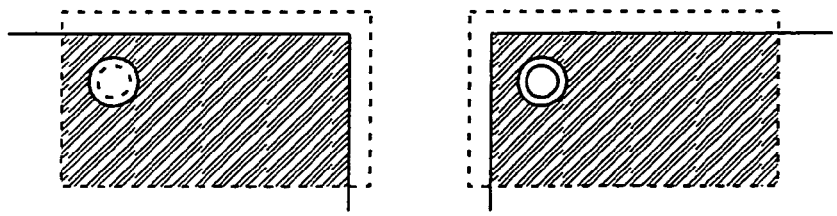
FIG. 5C

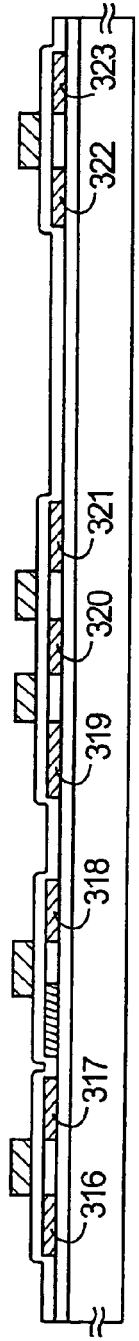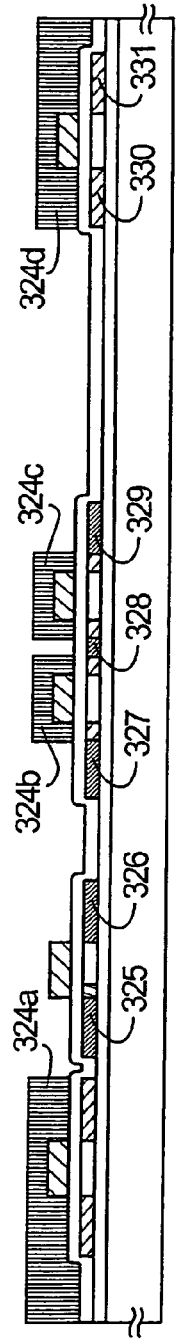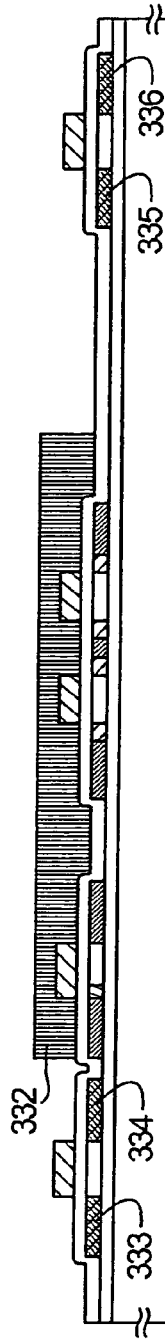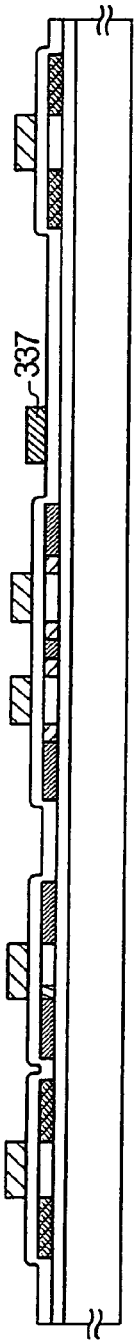

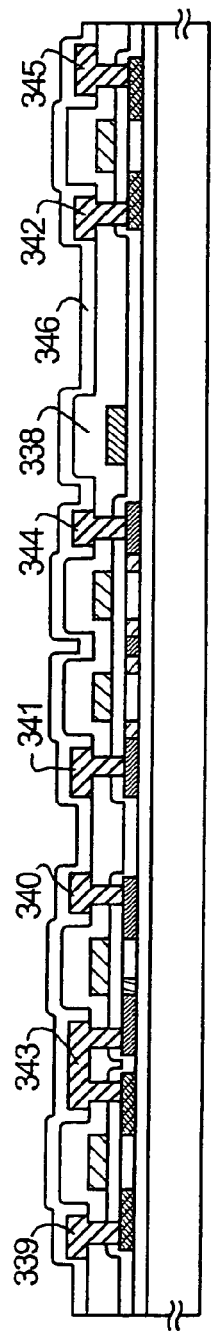
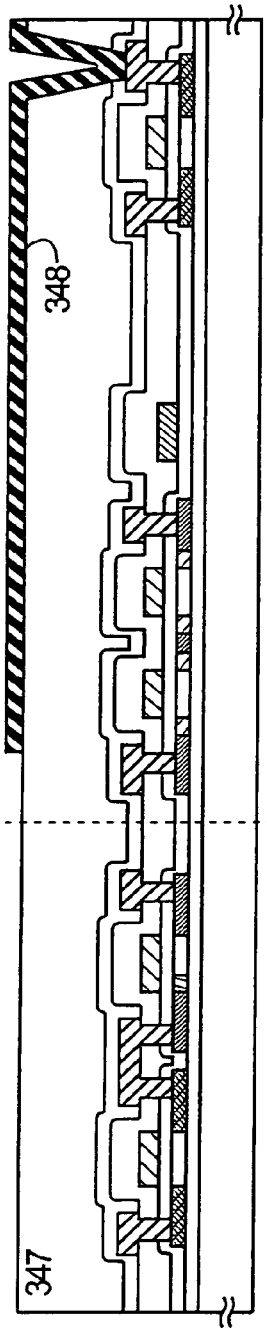
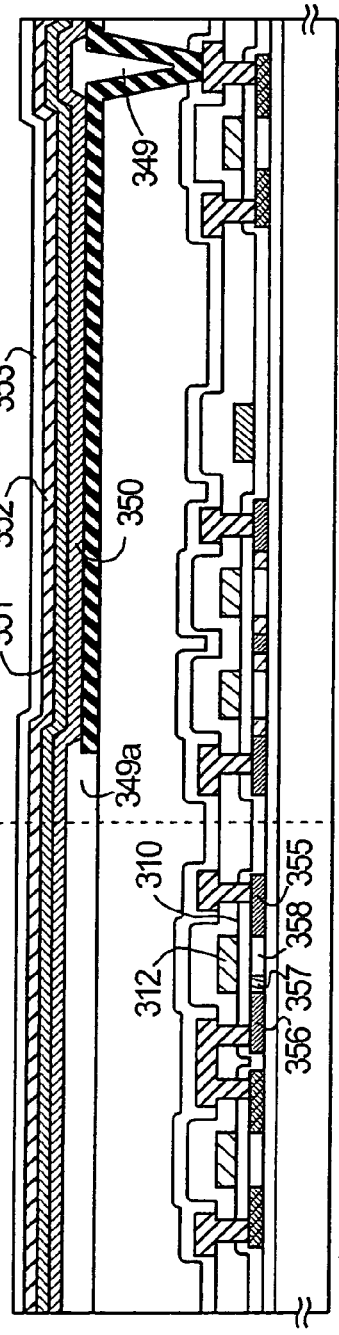

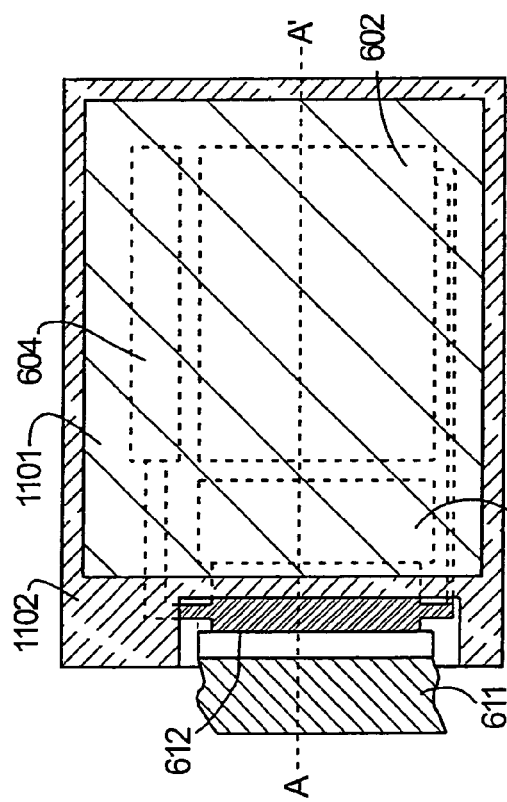
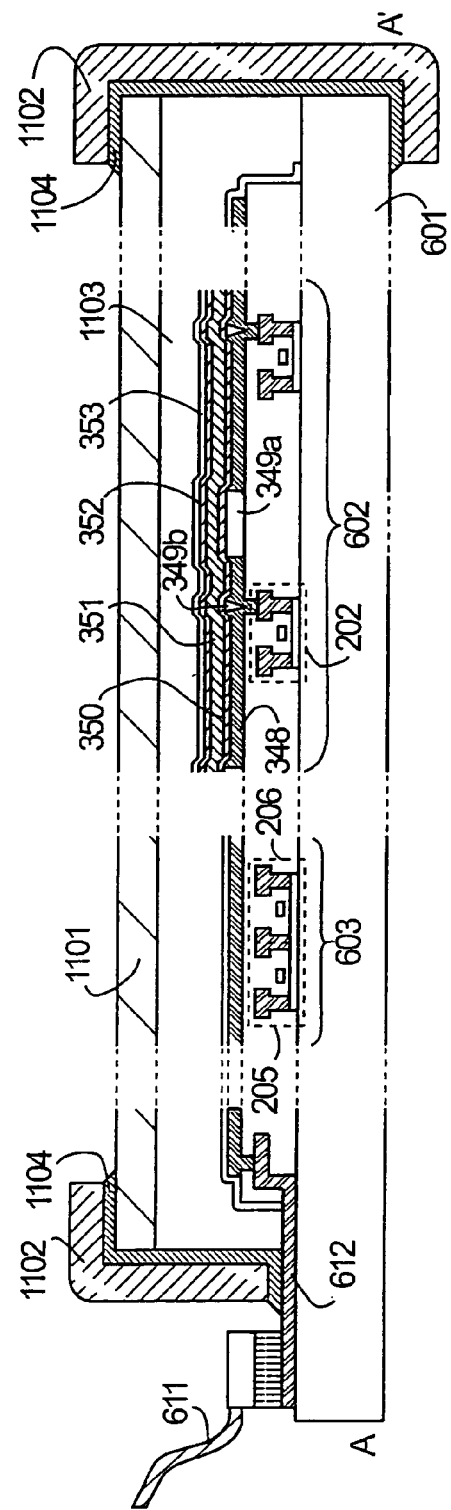
FIG. 12A
FIG. 12B

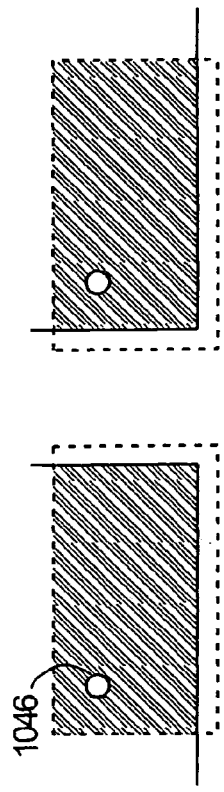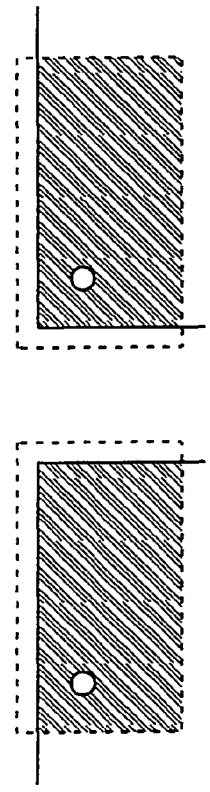
FIG. 13D
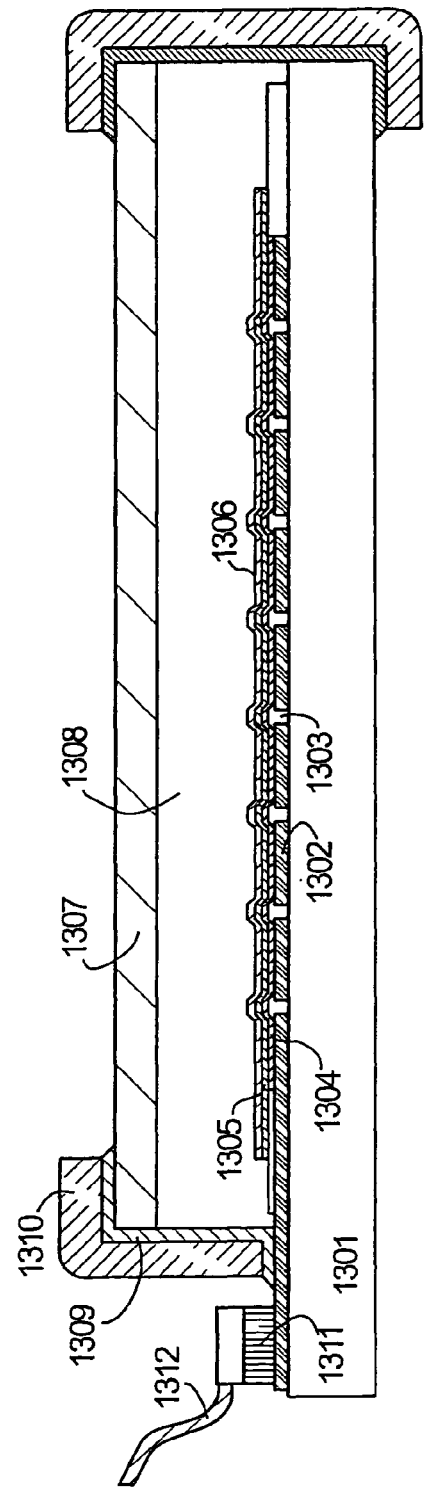
FIG. 14

SELF-LIGHT-EMITTING DEVICE AND METHOD OF MANUFACTURING THE SAME

This application is a continuation of U.S. application Ser. No. 10/929,896 filed on Aug. 30, 2004 now U.S. Pat. No. 7,132,693 which is a continuation of U.S. application Ser. No. 09/782,239, filed on Feb. 13, 2001 (now U.S. Pat. No. 6,833,560 issued Dec. 21, 2004).

BACKGROUND OF THE INVENTION

1. Field of the Invention

The present invention generally relates to a self-light-emitting device (also referred to as an EL device). In particular, the present invention relates to such a self-light emitting device in which an EL element, which is constructed of an anode, a cathode, and a light emitting organic material (hereinafter, referred to as organic EL material) with which EL (electro luminescence) is obtained, is sandwiched therebetween, is formed on an insulator, and to a method of manufacturing electric equipment having the self-light-emitting device as a display portion (display or display monitor). Note that in this specification, a description will be made of an EL display device as the above stated self-light-emitting device.

2. Description of the Related Art

In recent years, the development of display devices using an EL element (EL display device) as a self-light-emitting element which utilizes the EL phenomenon of light emitting organic material has been advancing. The EL display device is a self-light-emitting device, and therefore it doesn't need a back light such as that of a liquid crystal display device. In addition, the EL display device has a wide angle of view. As a result, the El display device is looked upon as promising as a display portion of electric equipment.

EL display devices are classified into two: a passive type (simple matrix type); and an active type (active matrix type), both of which have been actively developed. Particularly, the active matrix EL display device is attracting attention these days. With regard to organic EL materials to be an EL layer which can be said to be the center of an EL element, low molecular weight organic EL materials and high molecular (polymer) organic EL materials have been studied. The low molecular weight organic EL materials are formed by vapor deposition or the like, while the high molecular organic EL materials are formed through a coating using a spinner.

With respect to both the low molecular weight organic EL material and the high molecular (polymer) organic EL materials, when the surface on which the EL material is formed is not planarized, there is a problem in that the thickness of the formed EL material can not be even.

Further, in case that the thickness of the EL layer is not even and the EL layer is partly not formed at a step portion, when an EL element formed of a cathode, the EL layer, and an anode is formed, the cathode and the anode are short-circuited.

When the cathode and the anode are short-circuited, electric current intensively flows between the cathode and the anode, and almost no electric current flows through the EL layer, which makes the EL layer not to emit light.

SUMMARY OF THE INVENTION

The present invention has been made in view of the above, and an object of the present invention is to improve the structure of an EL element, and to provide a method of manufacturing an EL display device. Moreover, another object of the present invention is to provide an electric equipment having such an EL display device as a display portion.

In order to attain the above objects, according to the present invention, there is employed a structure such that when an EL layer is formed by an organic EL material for forming the EL layer, an insulator is embedded to planarize an uneven portion on the surface where the organic EL material is to be formed, thereby preventing a short circuit between a cathode and an anode in an EL element from occurring. FIGS. 1A to 1C illustrate the structure of cross sections of a pixel portion of an EL display device according to the present invention.

FIG. 1A illustrates a TFT for controlling electric current, which is electrically connected to a pixel electrode 40. After a base film 12 is formed on a substrate 11, the TFT for controlling electric current is formed so as to have an active layer including a source region 31, a drain region 32, and a channel forming region 34, a gate insulating film 18, a gate electrode 35, a first interlayer insulating film 20, a source wiring 36, and a drain wiring 37. Note that, although the gate electrode 35 is of a single-gate structure in the figure, it may be of a multi-gate structure.

Then, a first passivation film 38 is formed at the thickness of 10 nm to 1 μm (preferably 200 to 500 nm). As the material, an insulating film containing silicon (especially a silicon oxynitride film or a silicon nitride film is preferable) can be used.

A second interlayer insulating film (which may also be referred to as planarizing film) 39 is formed on the first passivation film 38 so as to cover the respective TFTs to planarize a step formed by the TFTs. As the second interlayer insulating film 39, an organic resin film such as a polyimide resin, a polyamide resin, an acrylic resin, or a resin containing a high molecular compound of siloxane is preferable. Of course, an inorganic film may also be used if it can perform sufficient planarization.

It is quite important to planarize, by the second interlayer insulating film 39, a step formed by the TFTs. Since an EL layer to be formed later is very thin, existence of a step may cause failure light emission. Therefore, it is preferable that planarization is performed prior to the formation of the pixel electrode in order to make as planar as possible the surface on which the EL layer is formed.

Further, reference numeral 40 denotes a pixel electrode (corresponding to an anode of the EL element) formed of a transparent conductive film, and is formed so as to be connected to the drain wiring 37 of the TFT for controlling electric current through a contact hole (opening) which is formed in the second interlayer insulating film 39 and the first passivation film 38.

According to the present invention, as the pixel electrode, a conductive film formed of a compound of indium oxide and tin oxide is used. A small amount of gallium may be doped into the compound. Moreover, a compound of indium oxide and zinc oxide, or a compound of zinc oxide and gallium oxide may be used.

Note that a concave portion 46, formed after the pixel electrode is formed in the contact hole, is herein referred to as an electrode hole. After the pixel electrode is formed, an EL material is formed to form an EL layer. In this case, however, as shown in FIG. 1B, the thickness of the EL layer in the electrode hole 46 becomes thinner in thin film region 47. Though the extent of the thinning of the film thickness depends on the tapered angle of the electrode hole, among the film forming surfaces, portions which are not vertical with respect to the film forming direction tend to have difficulty in having the formed film and tend to have thinner film thickness.

However, if the formed EL layer becomes thinner here, and in addition, a disconnected portion is formed, the cathode and the anode in the EL element are short-circuited, and electric current intensively flows through this short-circuited portion. This prevents electric current from flowing through the EL layer, which makes the EL layer not to emit light.

Accordingly, in order to prevent the short circuit between the cathode and the anode in the EL element, an organic resin film is formed on the pixel electrode so as to sufficiently fill up the electrode hole 46. By patterning the formed organic resin film, a protective portion 41b is formed. In other words, the protective portion 41b is formed so as to fill up the electrode hole. Note that a similar protective portion (not shown) of an organic resin film may also be formed in a space between pixel electrodes so as to fill up the space.

The organic resin film is formed by spin coating. After exposing the organic resin film to light using a resist mask, etching is performed to form the protective portion 41b as illustrated in FIG. 1C.

Note that the thickness of a rising portion in cross section of the protective portion 41b from the pixel electrode (a portion illustrated as Da in FIG. 1C) is 0.1 to 1 µm, preferably 0.1 to 0.5 µm, more preferably 0.1 to 0.3 µm.

Also, the material of the protective portion 41b is preferably an organic resin such as a polyimide resin, a polyamide resin, an acrylic resin, or a resin containing a high molecular compound of siloxane. Further, the viscosity of such an organic resin used is preferably $10^{-3}$ Pa·s to $10^{-1}$ Pa·s.

After the protective portion 41b is formed, as illustrated in FIG. 1C, an EL layer 42 is formed, and further, a cathode 43 is formed. Note that the EL material forming the EL layer 42 may be a low molecular weight organic EL material and may be a high molecular organic EL material.

By forming the structure illustrated in FIG. 1C as in the above, the problem of the short circuit between the pixel electrode 40 and the cathode 43 caused when the EL layer 42 is disconnected at a step portion in the electrode hole 46 can be solved.

BRIEF DESCRIPTION OF THE DRAWINGS

In the accompanying drawings:

FIGS. 5A to 5C are views showing cross sections of a pixel portion;

FIGS. 7A to 7D are views showing a manufacturing process of the EL display device;

FIGS. 8A to 8C are views showing a manufacturing process of the EL display device;

FIGS. 12A and 12B are views showing cross sections of an active matrix type EL display device;

FIGS. 13A to 13D are views showing cross sections of a pixel portion;

FIG. 14 is a view showing a cross section of a passive type EL display device;

DETAILED DESCRIPTION OF THE PREFERRED EMBODIMENTS

Embodiment Mode

Figure 2:
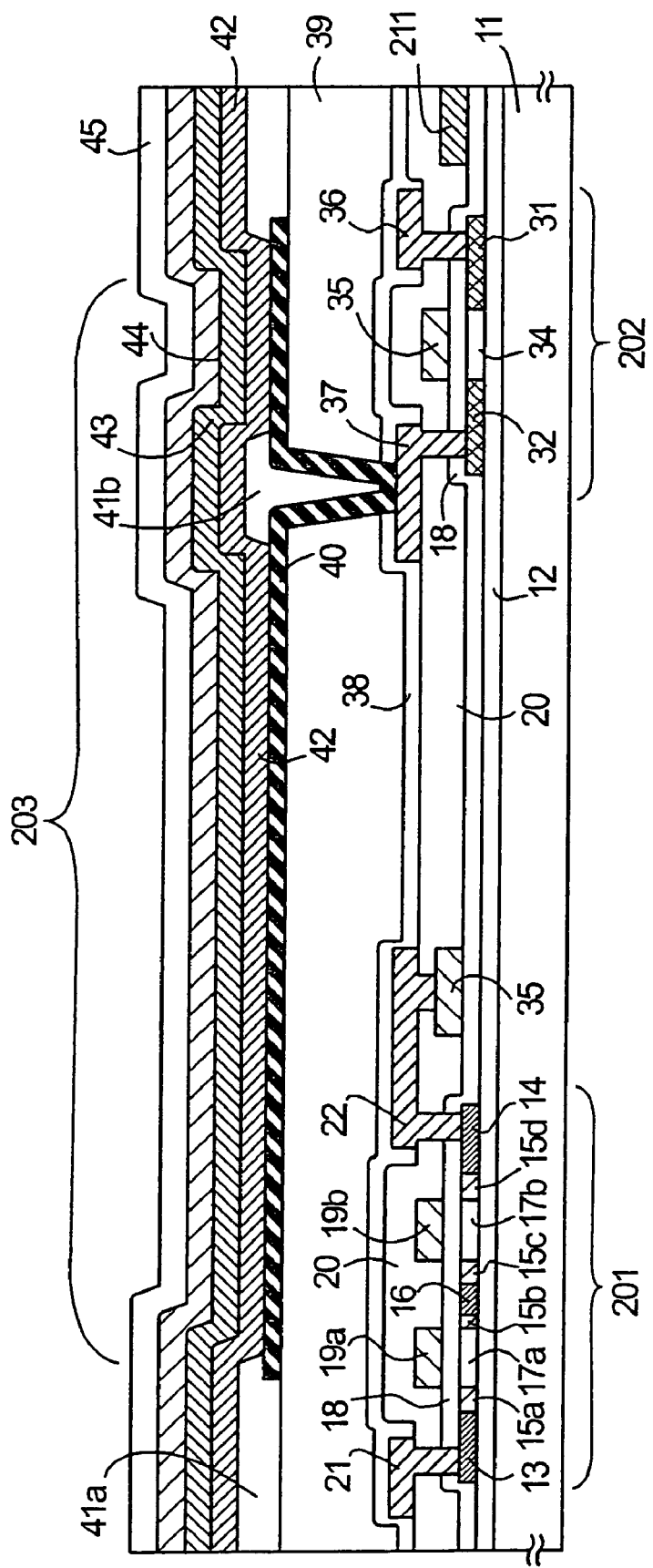
FIG. 2 is a view showing a cross section of the pixel portion.
Figure 3A:
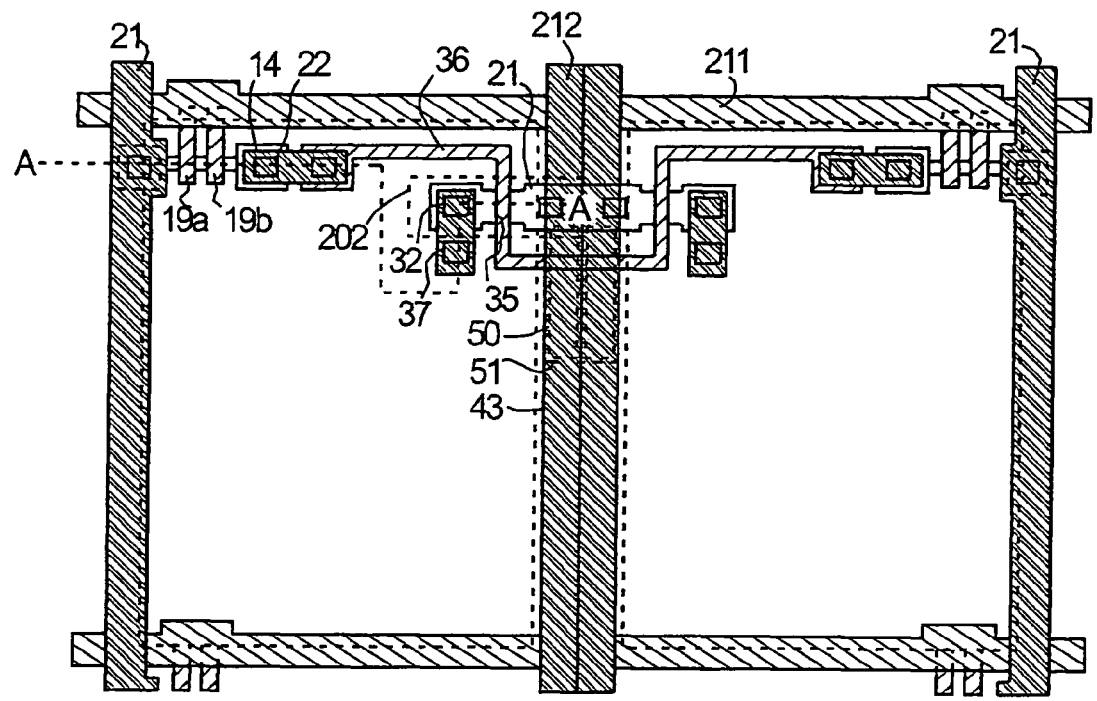
FIGS. 3A and 3B are views showing a top surface and a structure of the pixel portion, respectively.
Figure 3B:
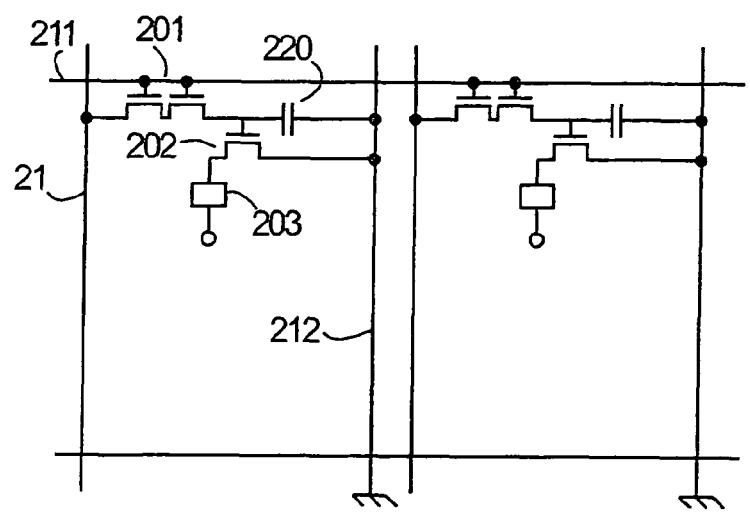

An embodiment mode of the present invention will be explained using FIG. 2 and FIGS. 3A and 3B. Shown in FIG. 2 is a cross sectional view of a pixel portion of an EL display according to the present invention. FIG. 3A shows a top view of the pixel portion, and FIG. 3B is a circuit structure of the pixel portion. In practice, a pixel portion (image display portion) is formed in which a plurality of pixels are arranged in matrix. Note that the cross sectional diagram taken along the line A-A' of FIG. 3A corresponds to FIG. 2. Common reference symbols are used in FIG. 2 and FIGS. 3A and 3B, and therefore both figures may be suitably referenced. Further, two pixels are shown in the top views of FIG. 3A, however either has the same structure.

In FIG. 2, reference numeral 11 denotes a substrate, and reference numeral 12 denotes an insulating film which becomes a base (hereafter referred to as base film). A substrate made from glass, glass ceramic, quartz, silicon, ceramic, a metal, or a plastic may be used as the substrate 11.

Further, although the base film 12 is especially effective for cases in which a substrate containing mobile ions, or a substrate having conductivity is used, it need not be formed for a quartz substrate. An insulating film containing silicon may be formed as the base film 12. Note that, in this specification, the term "insulating film containing silicon" indicates, specifically, an insulating film such as a silicon oxide film, a silicon nitride film, or an silicon oxynitride film (denoted by SiOxNy) containing silicon, oxygen, and nitrogen in predetermined ratios.

Further, the dispersion of TFT generated heat by giving the base film 12 a heat radiating effect is effective in preventing TFT degradation or EL element degradation. All known materials may be used in giving the heat radiating effect.

In this case, two TFTs are formed within the pixels. Reference numeral 201 denotes a switching TFT formed by an n-channel TFT, and reference numeral 202 denotes an electric current controlling TFT, formed by a p-channel TFT.

Note that it is not necessary to place limitations on the present invention such that the switching TFT is an n-channel TFT and the electric current controlling TFT is a p-channel TFT, and that it is possible to form the switching TFT using a p-channel TFT and to form the electric current controlling TFT using an n-channel TFT. It is also possible to use n-channel TFTs for both, and to use p-channel TFTs for both.

The switching TFT 201 is formed with: an active layer containing a source region 13, a drain region 14, LDD regions 15a to 15d, a high concentration impurity region 16, and channel forming regions 17a and 17b; a gate insulating film 18; gate electrodes 19a and 19b, a first interlayer insulating film 20, a source wiring 21, and a drain wiring 22.

Further, as shown in FIGS. 3A and 3B, this is a double gate structure in which the gate electrodes 19a and 19b are electrically connected by a gate wiring 211 formed by a different material (a material having a lower resistance than the gate electrodes 19a and 19b). Of course, in addition to the double gate structure, a single gate structure or a multi-gate structure (a structure containing an active layer having two or more channel forming regions connected in series) may also be employed. The multi-gate structure is extremely effective in lowering the value of the off current. Therefore, a switching element having a low off current value is realized with the present invention by using a multi-gate structure for the switching element 201.

Further, the active layer is formed of a semiconductor film containing a crystal structure. Namely, the active layer may be formed using a single crystal semiconductor film, a polycrystal semiconductor film, or a microcrystal semiconductor film. Further, the gate insulating film 18 may be formed of an insulating film containing silicon. In addition, all conductive films may be used for the gate electrodes, the source wiring, and the drain wiring.

In addition, the LDD regions 15a to 15d in the switching TFT 201 are formed sandwiching the gate insulating film 18, and so as not to overlap the gate electrodes 19a and 19b. Such structure is extremely effective in reducing the off current value.

Note that the formation of an offset region (a region having the semiconductor layer with the same composition as the channel forming regions, and to which a gate voltage is not applied) between the channel forming regions and the LDD regions is additionally preferable for reducing the off current value. Further, when a multi-gate structure having two or more gate electrodes is used, a high concentration impurity region formed between the channel forming regions is effective in lowering the value of the off current.

Next, the current controlling TFT 202 is formed with having: an active layer containing a source region 31, a drain region 32, and a channel forming region 34; the gate insulating film 18; a gate electrode 35; the first interlayer insulating film 20; a source wiring 36; and a drain wiring 37. Note that the gate electrode 35 has a single gate structure, however a multi-gate structure may also be used.

As shown in FIG. 2, the drain of the switching TFT 201 is electrically connected to the gate of the current controlling TFT 202. Specifically, the gate electrode 35 of the current controlling TFT 202 is electrically connected to the drain region 14 of the switching TFT 201 through the drain wiring (also referred to as connection wiring) 22. Further, the source wiring 36 is connected to an electric power supply line 212.

The current controlling TFT 202 is an element for controlling the amount of current injected into an EL element 203. However, if deterioration of the EL element is considered, it is not preferable that too much current is allowed to flow. It is therefore preferable to design the channel length (L) to be long so that an excess current does not flow in the current controlling TFT 202. The amount of current is preferably from 0.5 to 2 µA (more preferably between 1 and 1.5 µA) per pixel.

Also, the length (width) of the LDD regions formed in the switching TFT 201 may be set within a range of from 0.5 to 3.5 µm, typically between 2.0 and 2.5 µm.

Further, as illustrated in FIG. 3, in a region denoted as 50, through the gate insulating film, the wiring 36 that becomes the gate electrode 35 of the TFT 202 for controlling electric current overlaps a semiconductor film 51 which is formed simultaneously with the active layer. At this time, in the region 50, a capacitor is formed and functions as a storage capacitor 50 for storing voltage applied to the gate electrode 35 of the TFT 202 for controlling electric current. In addition, a capacitor formed of the wiring 36 that becomes the gate electrode, a first interlayer insulating film (not shown), and a power supply line 212 also forms the storage capacitor 50.

Note that a drain of the TFT for controlling electric current is connected to the power supply line 212, and constant voltage is always applied to the drain.

Further, seen from the viewpoint of increasing the amount of current which is allowed to flow, it is effective to make the film thickness of the active layer (especially the channel forming region) of the current controlling TFT 202 thick (preferably from 50 to 100 nm, more preferably between 60 and 80 nm). Conversely, seen from the point of view of making the off current value smaller for the switching TFT 201, it is also effective to make the film thickness of the active layer (especially the channel forming region) thin (preferably from 20 to 50 nm, more preferably between 25 and 40 nm).

Next, reference numeral 38 denotes a first passivation film, and its film thickness may be set from 10 nm to 1 µm (preferably between 200 and 500 nm). An insulating film containing silicon (in particular, it is preferable to use an silicon oxynitride film or a silicon nitride film) can be used as the passivation film material.

A second interlayer insulating film (this may also be referred to as a planarizing film) 39 is formed on the first passivation film 38 so as to cover each TFT, and performs the planarizing of steps of the TFTs. An organic resin film is preferable as the second interlayer insulating film 39, and resin materials such as an acrylic resin, and resins containing a high molecular compound of polyimide, polyamide, and siloxane may be used. An inorganic film may also be used, of course, provided that it is capable of sufficient planarizing.

It is extremely important to planarize the steps of TFTs by the second interlayer insulating film 39. EL layers later formed are extremely thin, and therefore there are cases in which light emission defects are caused by the existence of the steps. Consequently, it is preferable to perform planarization before forming the pixel electrodes so as to form the EL layers as planar as possible.

Further, reference numeral 40 denotes a pixel electrode (corresponding to an anode of the EL element) made from a transparent conductive film. After opening a contact hole in the second interlayer insulating film 39 and in the first passivation film 38, the pixel electrode 40 is formed so as to be connected to the drain wiring 37 of the current controlling TFT 202 in the formed opening portion.

A conductive thin film made of a chemical compound of indium oxide and tin oxide is used as the pixel electrode in this embodiment mode. Further, a small amount of gallium may also be added. In addition, a chemical compound of indium oxide and zinc oxide can also be used.

Then, an organic resin film of an organic resin is formed on the pixel electrode by spin coating so as to fill up the electrode hole 46 on the pixel electrode. Note that, in this case, an acrylic resin is used as the organic resin film.

Further, although the organic resin film of an organic resin is formed on the pixel electrode, an insulator, which can be an insulating film may also be used. Note that, as the insulator, an inorganic material containing silicon such as silicon oxide, oxidized silicon nitride, or silicon nitride may be used.

After the acrylic resin is formed on the whole surface, exposure to light is performed using a resist mask and etching is performed to form the protective portions 41a and 41b illustrated in FIG. 2.

The protective portion 41b is the portion of the pixel electrode where the electrode hole is filled up with the acrylic resin. The protective portion 41a is provided in a space between pixel electrodes. A space between pixel electrodes is a portion where no pixel electrode is formed in a pixel portion having a plurality of pixel electrodes formed therein, for example, a portion between pixel electrodes, etc. When etching is performed to form a protective portion, if the material forming the second interlayer insulating film between the pixel electrodes is the material forming the protective portion, there is a possibility in that the second interlayer insulating film is also simultaneously etched.

Note that the thickness of a rising portion in cross section of the protective portions 41a and 41b from the pixel electrode is 0.1 to 1 μm, preferably 0.1 to 0.5 μm, more preferably 0.1 to 0.3 μm.

Though a case where an acrylic resin is used as the organic resin for forming the protective portions 41a and 41b is described, the material may be a polyimide resin, a polyamide resin, or a resin containing a high molecular compound of siloxane such as CYCLOTEN. Further, the viscosity of such an organic resin used is preferably $10^{-3}$ Pa·s to $10^{-1}$ Pa·s.

By providing the protective portion 41b and filling up the electrode hole with the organic resin as in the above, the problem of the short circuit between the pixel electrode 40 (anode) and the cathode 43 caused when the EL layer 42 is disconnected, can be solved.

A method of manufacturing the protective portion 41b is now described with reference to FIG. 4.

Figure 4A:
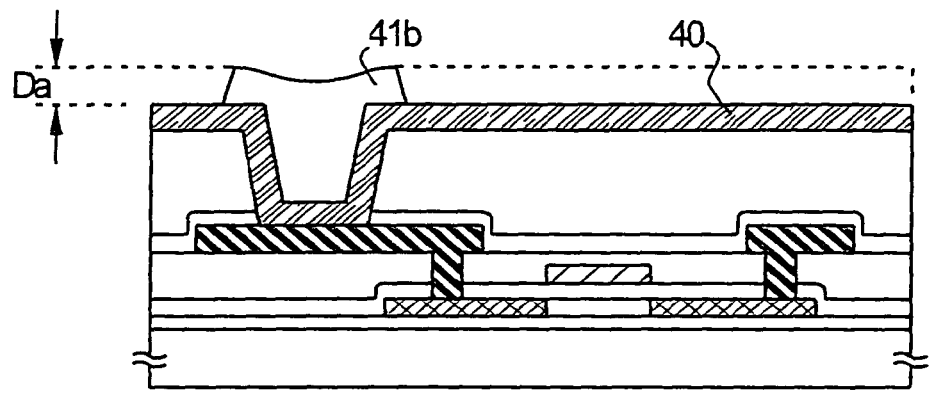
FIGS. 4A to 4C are views showing cross sections of a pixel portion.

FIG. 4A illustrates the protective portion 41b formed by patterning after the organic resin film is formed on the pixel electrode 40. Da denotes the thickness of the organic resin film. When the thickness is thin, a cavity develops in an upper portion as in the protective portion 41b of FIG. 4A.

The extent of the cavity depends on the tapered angle of the electrode hole and on the thickness of the organic resin film. If the thickness of the organic resin film is extremely thin, there is a fear that the electrode hole can not be filled up completely and the organic resin film can not act as the protective portion.

On the other hand, if the thickness of the organic resin film is thick, a step is again generated.

Figure 4B:
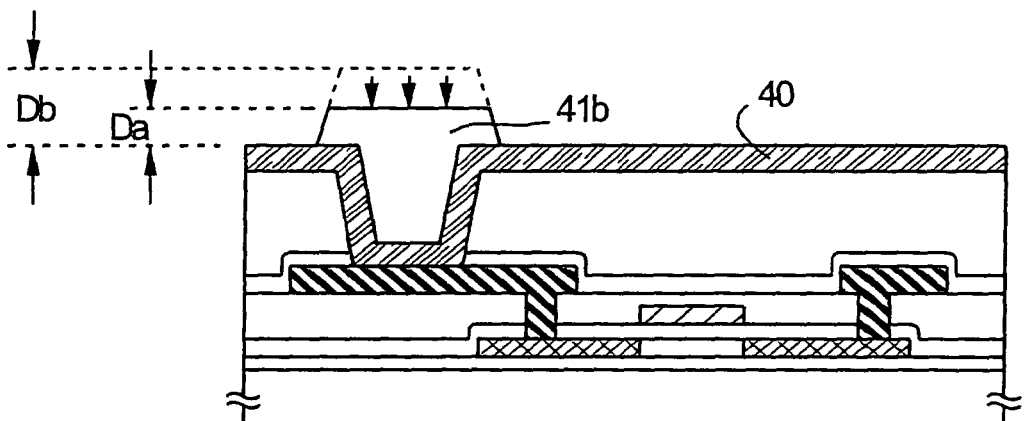
Figure 4C:
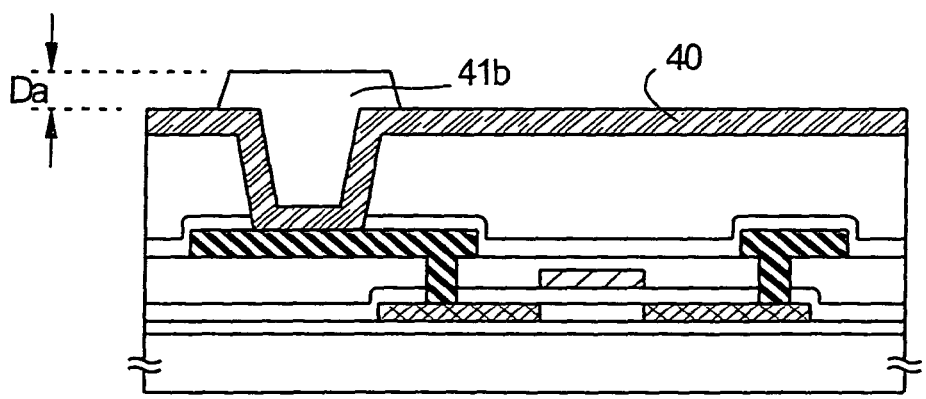

As a method of solving this problem, as illustrated in FIG. 4B, after the organic resin film is formed at the thickness of Db, the protective portion 41b is formed by patterning, and further, the whole surface is etched to make the thickness to be Da. This makes it possible to form the protective portion 41b with a planarized upper portion and an appropriate thickness as illustrated in FIG. 4C.

However, if the method illustrated in FIG. 4B is used, the pixel electrode exposed to the surface when the protective portion 41b is etched after being patterned is also subject to the etching. FIG. 5 illustrates a manufacturing method taking this point into consideration.

First, as illustrated in FIG. 5A, the organic resin film is formed at the thickness of Db on the pixel electrode 40. Then, the whole surface is etched to make the thickness to be Da. Further, patterning is performed to form the protective portion 41b.

With regard to the protective portion 41b, it may be formed by patterning after the organic resin is formed as illustrated in FIG. 4A, or, it may be formed by etching the whole surface after patterning as illustrated in FIG. 4B. Further, as illustrated in FIG. 5A, it may be formed by patterning after the whole surface is etched.

As illustrated in FIG. 5, the outer diameter Rb of the protective portion 41b and the inner diameter Ra of the electrode hole 46 have a relationship of Rb>Ra. Note that the protective portion 41b described with reference to FIG. 4 or FIG. 5 has the structure illustrated in FIG. 5C. More specifically, a solid line of 41a in FIG. 5C represents the outer diameter of the protective portion 41b, while a broken line of 41b in FIG. 5C represents the inner diameter of the electrode hole 46.

Then, the EL layer 42 is formed. Here, a method of forming the EL layer by spin coating a high molecular organic EL material dissolved in a solvent is described. Note that, though a description will be made of a case, as an example, where a high molecular organic EL material is used as the organic EL material for forming the EL layer, a low molecular weight organic EL material may also be used.

Polyparaphenylene vinylene (PPV), polyvinyl carbazole (PVK) and polyfluorane can be given as typical high molecular organic materials.

Note that there are various types of PPV organic EL materials, and for example, chemical formulae such as those below have been reported. (See H. Shenk, H. Becker, O. Gelsen, E; Kluge, W. Kreuder, and H. Spreitzer, "Polymers for Light Emitting Diodes," Euro Display, Proceedings, 1999, pp. 33-7.)

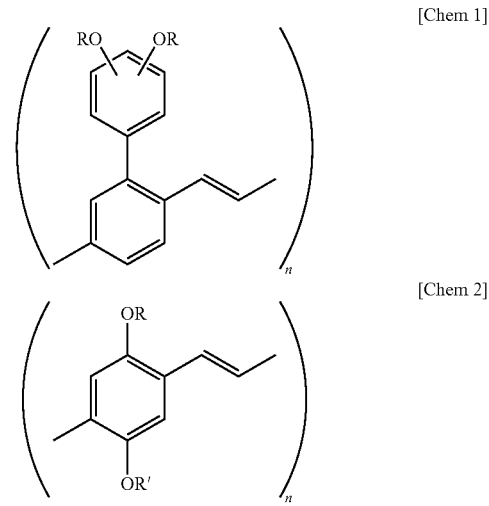

[Chem 1]

[Chem 2]

Further, polyphenylvinyl having the chemical formula disclosed in Japanese Patent Application Laid-open No. Hei 10-92576 can also be used. The chemical formula is as below.

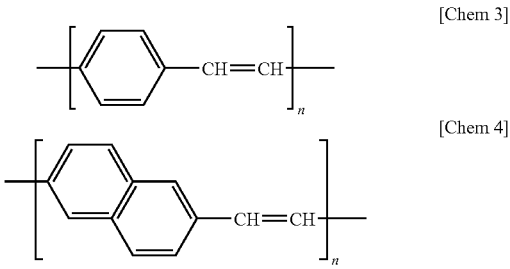

[Chem 3]

[Chem 4]

In addition, as a PVK organic EL material, the following chemical formula is included therein.

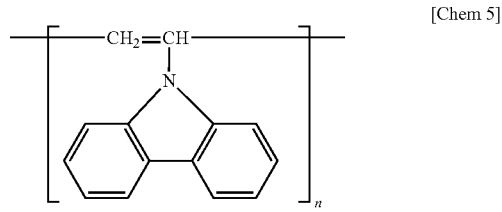

[Chem 5]

The polymer organic EL material can be coated while dissolving the material in a solvent as a polymer. Also, the material can be polymerized after dissolving it in a solvent as a monomer and coating it. When coating it in a monomer state, first a polymer precursor is formed. By heating it within a vacuum, polymerization is effected to form a polymer.

As specific EL layers, cyano-paraphenylene vinylene may be used in a red color light emitting EL layer; polyphenylene vinylene may be used in a green light emitting EL layer; and polyphenylene vinylene or polyalkylphenylene may be used in a blue color light emitting EL layer. The film thickness may be set from 30 to 150 nm (preferably between 40 and 100 nm).

Note that the above materials are exemplified as one example of organic EL materials which can be used as EL layers in the present invention, thereby being not necessary to limit the materials to those.

Also, toluene, xylene, chlorobenzene, dichlorobenzene, anisole, chloroform, dichloromethane, ā-butylractone, butyl-cell-solve, cychlohexane, NMP (N-methyl-2-piloridon), cyclohexanone, dioxane, and THF (tetrahydrofluorane) are exemplified as typical solvents.

Figure 1A:
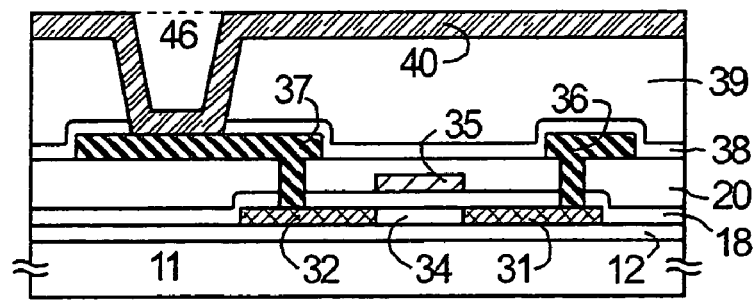
FIGS. 1A to 1C are views showing cross sections of a pixel portion.
Figure 1B:
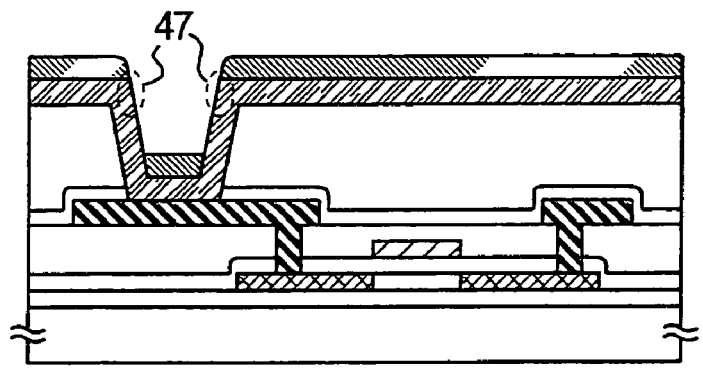
Figure 1C:
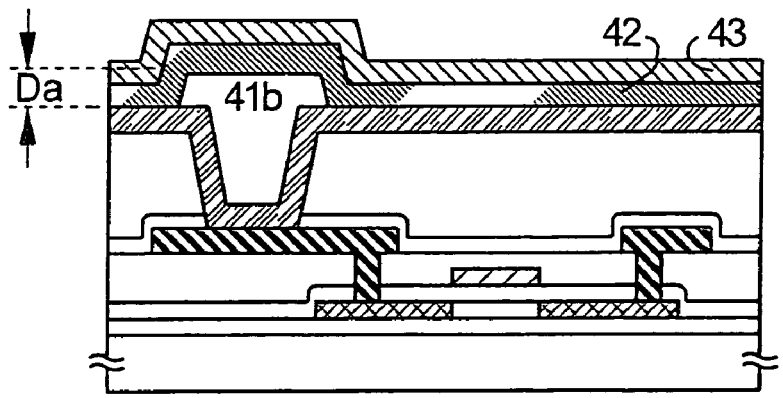

In addition, the EL layer 42 easily degrades in accordance with the existence of hydrogen or oxygen when forming the EL layer 42, and therefore it is preferable to perform film formation within an inert gas, such as nitrogen or argon, as an atmosphere having little hydrogen and oxygen for the process environment. In addition, an environment of the solvent used in the coating process may also be used as the process atmosphere because the vaporization speed of the solvent, in which an EL material is dissolved, may be controlled. Note that, in order to perform film formation of the light emitting layers within this atmosphere, it is preferable that the thin film formation apparatus of FIG. 1 may be placed in a clean booth filled with an inert gas.

Also, with regard to the method of forming the EL layer, other than spin coating described here, ink jetting or the like may be employed.

Further, in case that the EL layer is formed of a low molecular weight organic EL material, vapor deposition or the like may also be used. Note that, as the low molecular weight organic EL material, known materials can be used.

After forming the EL layer 42 as above, a cathode 43 made from a shading conductive film, a protective electrode 44, and a second passivation film 45 are formed next. A conductive film made from MgAg is used as the cathode 43 in this embodiment mode, and a conductive film made from aluminum is used as the protective electrode 44. Further, a silicon nitride film having a thickness of 10 nm to 1 μm (preferably between 200 and 500 nm) is used as a second passivation film 45.

Note that the EL layers are weak with respect to heat as stated above, and therefore it is preferable to perform film formation of the cathode 43 and the second passivation film 45 at as low a temperature as possible (preferably in the range from room temperature to 120° C.). It can therefore be said that plasma CVD, vacuum evaporation, and solution coating (spin coating) are desirable as the film deposition methods.

That which is thus completed is referred to as an active matrix substrate, and an opposing substrate (not shown) is formed opposing the active matrix substrate. A glass substrate is used as the opposing substrate in this embodiment mode. Note that a substrate made from plastic or ceramic may also be used as the opposing substrate.

Further, the active matrix substrate and the opposing substrate are joined by a sealant (not shown), with the result that an airtight space (not shown) is formed. The airtight space is filled with argon in this embodiment mode. It is also possible, of course, to arrange a drying agent such as barium oxide and to arrange an oxidation preventing agent within the airtight space.

Further, by forming a film of a metal having a low work function and liable to be oxidized or of a hygroscopic metal on the surface of an opposing substrate on the side of the active matrix substrate, a function to capture oxygen or a hygroscopic function can be provided. Note that, if such a metal film is formed after unevenness is produced on the opposing substrate with an organic resin such as a photosensitive acrylic resin, the surface area can be made larger, which is more effective.

EMBODIMENTS

Embodiment 1

A method of simultaneously forming a TFT in a pixel portion and a TFT in a driver circuit portion provided on the periphery thereof in accordance with an embodiment of the present invention is now described with reference to FIGS. 6 to 8. Note that, for the sake of simplicity of the description, with regard to the driver circuit, only a CMOS circuit as a basic circuit is illustrated.

Figure 6A:
FIGS. 6A to 6E are views showing a manufacturing process of an EL display device.

First, as illustrated in FIG. 6A, a base film 301 is formed at the thickness of 300 nm on a glass substrate 300. In this embodiment, as the base film 301, a silicon oxynitride film at the thickness of 100 nm and a silicon oxynitride film at the thickness of 200 nm laminated thereto are used. In this case, the concentration of nitrogen of the film in contact with the glass substrate 300 is preferably 10 to 25 wt %. Of course, an element may be directly formed on a quartz substrate without providing such a base film.

Then, an amorphous silicon film (not shown) at the thickness of 50 nm is formed on the base film 301 by a known film formation method. Note that the film formed here is not limited to the amorphous silicon film, and may be a semiconductor film containing amorphous structure (including a microcrystal semiconductor film). Further, the film may be a compound semiconductor film containing amorphous structure such as an amorphous silicon germanium film. The film thickness is preferably 20 to 100 nm.

Then, the amorphous silicon film is crystallized by a known technology to form a crystal silicon film (also referred to as a polycrystal silicon film or a polysilicon film) 302. The known crystallizing technology includes thermal crystallization using an electric furnace, laser anneal crystallization using a laser light, and lamp anneal crystallization using infrared light. In this embodiment, an excimer laser light using XeCl gas is used to perform the crystallization.

Note that, though a pulse oscillation type excimer laser light processed to be linear is used in this embodiment, the laser light may be rectangular. Also, a continuous oscillation type argon laser light or a continuous oscillation type excimer laser light may be used.

Though a crystal silicon film is used as the active layer of the TFTs in this embodiment, an amorphous silicon film may also be used. Further, it may be that the active layer switching TFT, which is required to lower the off current is formed of an amorphous silicon film, and the active layer of the electric current controlling TFT is formed of a crystal silicon film. Since the carrier mobility of the amorphous silicon film is low, it conducts less electric current, and thus, off current is less liable to flow. Therefore, both the advantage of an amorphous silicon film, which conducts less electric current and the advantage of a crystal silicon film, which conducts more electric current, can be utilized.

Figure 6B:
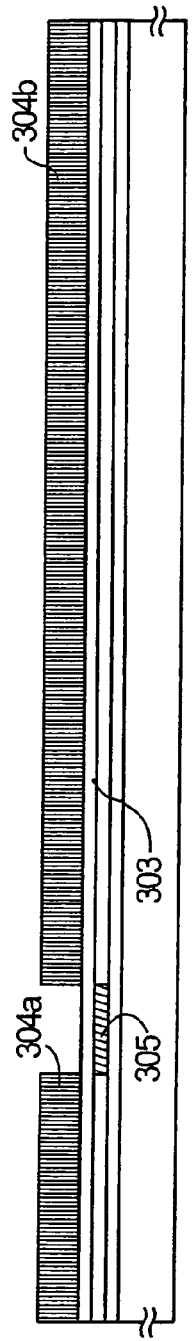

Then, as illustrated in FIG. 6B, a protective film 303 of a silicon oxide film is formed at the thickness of 130 nm on the crystal silicon film 302. The thickness of the protective film 303 may be selected from the range of 100 to 200 nm (preferably 130 to 170 nm). The protective film 303 may be any insulating film containing silicon. The protective film 303 is provided so that, when impurity is doped, the crystal silicon film is not directly exposed to plasma and that precise concentration control is made possible.

Then, resist masks 304a and 304b are formed on the protective film 303, and an impurity element imparting n-type (hereinafter referred to as n-type impurity element) is doped through the protective film 303. As the n-type impurity element, representatively, an element belonging to a group 15, typically phosphorus or arsenic can be used. Note that, in this embodiment, phosphorus is doped at the concentration of $1 \times 10^{18}$ atoms/cm$^3$ by plasma (ion) doping using plasma excited phosphine (PH$_3$) without mass separation. Of course, ion implantation with mass separation may also be used.

The dose is controlled such that the n-type impurity element is contained in an n-type impurity region 305 formed in this process at the concentration of $2 \times 10^{16}$ to $5 \times 10^{19}$ atoms/cm$^3$ (representatively $5 \times 10^{17}$ to $5 \times 10^{18}$ atoms/cm$^3$).

Figure 6C:
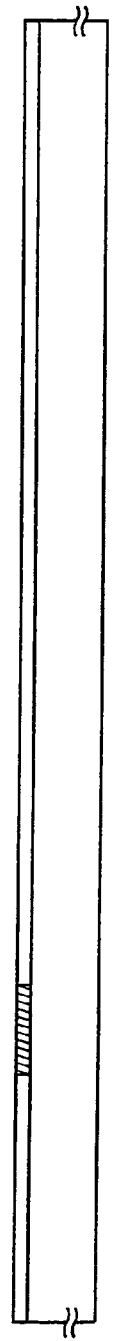

Then, as illustrated in FIG. 6C, the protective film 303 and the resist masks 304a and 304b are removed, and the added element belonging to the group 15 is activated. The activation may be performed using a known technology. In this embodiment, the activation is performed by irradiation of an excimer laser light. Of course, the excimer laser light may be a pulse oscillation type and may be a continuous oscillation type, and the method for activation is not limited to the excimer laser light. However, since the object is to activate the doped impurity element, energy irradiation to an extent with which the crystal silicon film is not melted is preferable. Note that the laser light may be irradiated without removing the protective film 303.

Note that the activation of the impurity element with the laser light may be made together with activation with heat treatment. In case that such activation with heat treatment is performed, taking into consideration the heat resistance of the substrate, heat treatment is performed preferably at about 450 to 550° C.

This process clarifies an end portion of the n-type impurity region 305, that is, a boundary portion (junction portion) between the n-type impurity region 305 and the region around the n-type impurity region 305 with no n-type impurity element doped therein. This means that, at a time when the TFT is completed later, an LDD region and a channel forming region can form a very satisfactory junction portion.

Figure 6D:
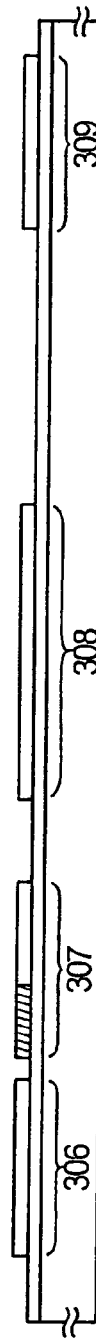

Then, as illustrated in FIG. 6D, unnecessary portions of the crystal silicon film are removed to form island-like semiconductor films (hereinafter referred to as active layers) 306 to 309.

Figure 6E:
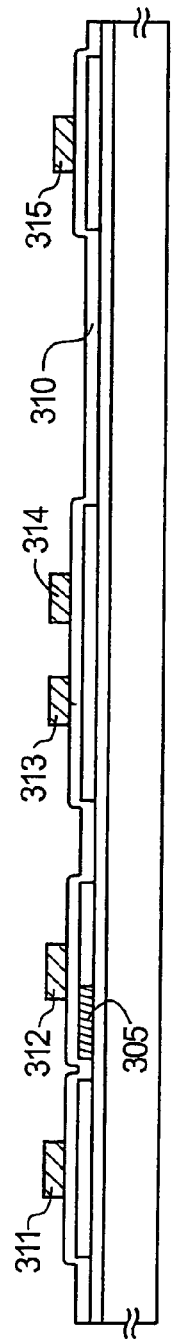

Then, as illustrated in FIG. 6E, a gate insulating film 310 is formed so as to cover the active layers 306 to 309. As the gate insulating film 310, an insulating film containing silicon at the thickness of 10 to 200 nm, preferably 50 to 150 nm is used. The film 310 may be of a single layer structure or may be of a laminated structure. In this embodiment, a silicon oxynitride film at the thickness of 110 nm is used.

Then, a conductive film at the thickness of 200 to 400 nm is formed and patterned to form gate electrodes 311 to 315. The end portions of the gate electrodes 311 to 315 may be tapered. Note that, in this embodiment, the material of the gate electrodes are different from the material of wirings for leading which are electrically connected to the gate electrodes (hereinafter referred to as gate wirings). More specifically, the material of the gate wirings has lower resistance than that of the material of the gate electrodes. This is for the purpose of using a material which can be precisely processed for the gate electrodes and of using a material which may not be precisely processed but which has low resistance for the gate wirings. Of course, the gate electrodes and the gate wirings may be formed of the same material.

Though the gate electrodes may be formed of a single layer conductive film, they are preferably formed of a laminated film having, for example, two layers or three layers as necessity requires. The material of the gate electrode may be any known conductive film. However, preferably, as described in the above, the material can be precisely processed. More specifically, it is preferable that the material can be patterned to have the line width of 2 μm or less.

Representatively, a film formed of an element selected from the group consisting of tantalum (Ta), titanium (Ti), molybdenum (Mo), tungsten (W), chromium (Cr), and silicon (Si), a film formed of a nitride of the above elements (representatively, a tantalum nitride film, a tungsten nitride film, or a titanium nitride film), a film formed of an alloy of the above elements (representatively Mo—W alloy or Mo—Ta alloy), or a film formed of a silicide of the above elements (representatively, a tungsten silicide film or a titanium silicide film) can be used. Of course, these films may be used as a single layer or may be laminated.

In this embodiment, a laminated film formed of a tantalum nitride (TaN) film at the thickness of 50 nm and a tantalum (Ta) film at the thickness of 350 nm is used. This film may be formed by sputtering. By adding as a sputtering gas an inert gas such as Xe or Ne, peeling off of the film due to stress can be prevented.

Further, in this case, the gate electrode 312 is formed so as to overlap a part of the n-type impurity region 305 while sandwiching the gate insulating film 310. This overlap portion becomes an LDD region later, which overlaps the gate electrode. Note that, though the gate electrodes 313 and 314 appear to be separated in section, they are actually electrically connected to each other.

Then, as illustrated in FIG. 7A, an n-type impurity element (phosphorus in this embodiment) is doped in a self-aligning manner using as masks the gate electrodes 311 to 315. Control is made so that the concentration of phosphorus doped in impurity regions 316 to 323 formed in this way is ½ to ¹⁄₁₀ (representatively, ⅓ to ¼) of that in the n-type impurity region 305. More specifically, it is preferable that the concentration is $1 \times 10^{16}$ to $5 \times 10^{18}$ atoms/cm$^3$ (typically, $3 \times 10^{17}$ to $3 \times 10^{18}$ atoms/cm$^3$).

Then, as illustrated in FIG. 7B, resist masks 324a to 324d are formed so as to cover the gate electrodes and the like, and an n-type impurity element (phosphorus in this embodiment) is doped to form impurity regions 325 to 329 containing phosphorus at a high concentration. In this case, too, ion doping using phosphine (PH$_3$) is performed. Control is made so that the concentration of phosphorus in this region is $1 \times 10^{20}$ to $1 \times 10^{21}$ atoms/cm$^3$ (representatively, $2 \times 10^{20}$ to $5 \times 10^{21}$ atoms/cm$^3$).

This process forms a source region and a drain region of an n-channel type TFT. However, with regard to the switching TFT, part of the n-type impurity regions 319 to 321 formed in the process of FIG. 7A are left. The left regions correspond to LDD regions 15a to 15d, respectively, of the switching TFT 201 of in FIG. 2.

Then, as illustrated in FIG. 7C, the resist masks 324a to 324d are removed, and a resist mask 332 is newly formed. Then, a p-type impurity element (boron in this embodiment) is doped to form impurity regions 333 to 336 containing boron at a high concentration. In this case, boron is doped by ion doping using diborane ($B_2H_6$) such that the concentration is $3\times10^{20}$ to $3\times10^{21}$ atoms/cm$^3$ (representatively, $5\times10^{20}$ to $1\times10^{21}$ atoms/cm$^3$).

Note that, while phosphorus has already been doped in the impurity regions 333 to 336 at the concentration of $1\times10^{20}$ to $1\times10^{21}$ atoms/cm$^3$, the concentration of boron doped in this process is at least three times as much as that of phosphorus. Therefore, the n-type impurity regions previously formed are completely reversed to a p-type, and function as p-type impurity regions.

Then, after the resist mask 332 is removed, the n-type and p-type impurity elements doped at their respective concentrations are activated. The activation can be performed by furnace annealing, laser annealing, or lamp annealing. In this embodiment, heat treatment in a nitrogen atmosphere at 550° C. for four hours is performed in an electric furnace.

In this case, it is important to remove oxygen in the atmosphere as much as possible. This is because, if any oxygen exists at all, the surfaces of the exposed gate electrodes are oxidized, which leads to increased resistance and difficulty in forming an ohmic contact later. Accordingly, it is desirable that the concentration of oxygen in the processing atmosphere in the above activation process, is 1 ppm or less, preferably 0.1 ppm or less.

After the activation process is completed, a gate wiring 337 at the thickness of 300 nm is formed as illustrated in FIG. 7D. The material of the gate wiring 337 may be a metal containing as a main component aluminum (Al) or copper (Cu) (the percentage is 50 to 100% as a composition). With regard to the arrangement, as illustrated in FIG. 3, the gate wiring is formed such that the gate wiring 211 is electrically connected to gate electrodes 19a and 19b (313 and 314 of FIG. 6E) of the switching TFT.

With taking such a structure, the wiring resistance of the gate wiring can be made extremely small, and therefore, an image display region (pixel portion) having a large area can be formed. More specifically, the pixel structure according to the present example is extremely effective in realizing an EL display device having a screen the diagonal size of which is 10 inches or larger (and further, 30 inches or larger).

Then, as illustrated in FIG. 8A, a first interlayer insulating film 338 is formed. As the first interlayer insulating film 338, a single layer insulating film containing silicon, or a laminated film which is a combination of two or more kinds of insulating films containing silicon may be used. Also, the film thickness may be 400 nm to 1.5 μm. In this embodiment, it may employ a structure in which a silicon oxide film at the thickness of 800 nm is laminated on a silicon oxynitride film at the thickness of 200 nm.

Further, heat treatment at 300 to 450° C. for one to twelve hours is performed in an atmosphere containing 3 to 100% of hydrogen to perform hydrogenation. This process is a process where dangling bonds in the semiconductor film are terminated by hydrogen using thermally excited hydrogen. The hydrogenation may also be performed by plasma hydrogenation (using plasma hydrogen).

Note that the hydrogenation may be performed during the first interlayer insulating film 338 is formed. More specifically, the above hydrogenation may be performed after the silicon oxynitride film at the thickness of 200 nm is formed and before the silicon oxide film at the thickness of 800 nm is formed.

Then, contact holes are formed in the first interlayer insulating film 338 and the gate insulating film 310, and source wirings 339 to 342 and drain wirings 343 to 345 are formed.

Note that, in this embodiment, the electrodes are laminated films having a three-layer structure formed by continuously forming by sputtering a Ti film at the thickness of 100 nm, an aluminum film containing Ti at the thickness of 300 nm, and a Ti film at the thickness of 150 nm. Of course, other conductive films may also be used.

Subsequently, a first passivation film 346 at the thickness of 50 to 500 nm (representatively 200 to 300 nm) is formed. In this embodiment, a silicon oxynitride film at the thickness of 300 nm is used as the first passivation film 346. Instead of the silicon oxynitride film, a silicon nitride film may be used.

Note that plasma treatment using gas containing hydrogen such as $H_2$ or $NH_3$ prior to the formation of the silicon oxynitride film is effective. By supplying hydrogen excited by this pretreatment to the first interlayer insulating film 338, and by performing heat treatment, the quality of the first passivation film 346 is improved. At the same time, hydrogen doped in the first interlayer insulating film 338 is diffused to the lower layer side. Therefore, the active layers can be hydrogenated effectively.

Then, as illustrated in FIG. 8B, a second interlayer insulating film 347 of an organic resin is formed. As the organic resin, a polyimide resin, a polyamide resin, an acrylic resin, or a resin containing a high molecular compound of siloxane can be used. In particular, since the second interlayer insulating film 347 is more expected to perform the planarization, an acrylic resin which is excellent in planarity is preferable. In this embodiment, an acrylic resin film is formed at a thickness with which a step formed by the TFTs is sufficiently planarized. Preferably, the thickness of the acrylic resin is 1 to 5 μm (more preferably, 2 to 4 μm).

Then, a contact hole is formed in the second interlayer insulating film 347 and the first passivation film 346, and a pixel electrode 348 electrically connected to the drain wiring 345 is formed. In this embodiment, an indium tin oxide (ITO) film is formed at the thickness of 110 nm, and is patterned to form the pixel electrode. A transparent conductive film of indium oxide with 2 to 20% of zinc oxide (ZnO) mixed therewith may also be used. This pixel electrode becomes the anode of the EL element.

Then, as illustrated in FIG. 8C, protective portions 349a and 349b of an organic resin are formed. The protective portions 349a and 349b may be formed by patterning a resin film such as an acrylic resin film or a polyimide film at the thickness of 1 to 2 μm. As illustrated in FIG. 3, the protective portions 349a and 349b are formed in a space between pixel electrodes and in an electrode hole, respectively.

Then, an EL layer 350 is formed. More specifically, an organic EL material which becomes the EL layer 350 is dissolved in a solvent such as chloroform, dichloromethane, xylene, toluene, tetrahydrofuran, or N-methylpyrrolidone, and is applied by spin coating. Then, the solvent is volatilized by heat treatment. In this way, the film of the organic EL material (EL layer) is formed.

In this embodiment, after the EL material is formed at the thickness of 80 nm, heat treatment for one to five minutes is performed using a hot plate at 80 to 150° C. to volatize the solvent.

Note that a known material can be used as the EL material. Taking into consideration the driving voltage, such a known material is preferably an organic material. Note that, since the EL layer 350 is of a single layer structure in this embodiment, it may be of a laminated structure having an electron injection layer, an electron transmission layer, a hole transmission layer, a hole injection layer, an electron block layer, or a hole element layer as necessity requires. Further, though, in this embodiment, a case where an MgAg electrode is used as a cathode 351 of the EL element is described, other known materials may also be used.

After the EL layer 350 is formed, the cathode (MgAg electrode) 351 is formed by vacuum evaporation. Note that the thickness of the EL layer 350 is preferably 80 to 200 nm (typically 100 to 120 nm) and the thickness of the cathode 351 is preferably 180 to 300 nm (typically 200 to 250 nm).

Further, a protective electrode 352 is provided on the cathode 351. As the protective electrode 352, a conductive film containing as the main component aluminum may be used. The protective electrode 352 may be formed by vacuum evaporation using a mask.

Finally, a second passivation film 353 of a silicon nitride film is formed at the thickness of 300 nm. Though, actually, the protective electrode 352 protects the EL layer from moisture and the like, by further forming the second passivation film 353, the reliability of the EL element can be further enhanced.

In case of the present embodiment, as illustrated in FIG. 8C, the active layer of the n-channel type TFT 205 includes a source region 355, a drain region 356, an LDD region 357, and a channel forming region 358. The LDD region 357 overlaps the gate electrode 312 while sandwiching the gate insulating film 310.

The LDD region is formed only on the side of the drain region, so as not to lower the operation speed. Further, with regard to the n-channel type TFT 205, it is not necessary to consider the off current, and the operation speed is more important. Therefore, it is desirable that the LDD region 357 is completely covered with the gate electrode to make the resistance component as small as possible. In other words, it is preferable that there is no so-called offset.

In this way, the active matrix substrate having the structure as illustrated in FIG. 8C is completed.

By the way, by arranging most appropriately structured TFTs not only in the pixel portion but also in the driver circuit portion, an active matrix substrate according to the present embodiment is extremely reliable, and its operation characteristics can be improved.

First, a TFT structured to decrease hot carrier injection so as not to lower the operation speed as much as possible is used as the n-channel type TFT 205 of the CMOS circuit for forming the driver circuit portion. Note that the driver circuit as referred herein includes a shift register, a buffer, a level shifter, and a sampling circuit (a sample-and-hold circuit). In case digital driving is performed, a signal conversion circuit such as a D/A converter may be included.

Note that, among driver circuits, a sampling circuit is different a little from other circuits and a large amount of current bidirectionally flows through the channel forming region. In other words, the function of the source region and the function of the drain region are reversed. Further, it is necessary to suppress the off current value as much as possible. In this sense, it is desirable that a TFT having a function which is between the function of the switching TFT and the function of the electric current controlling TFT, is arranged.

Figure 9:
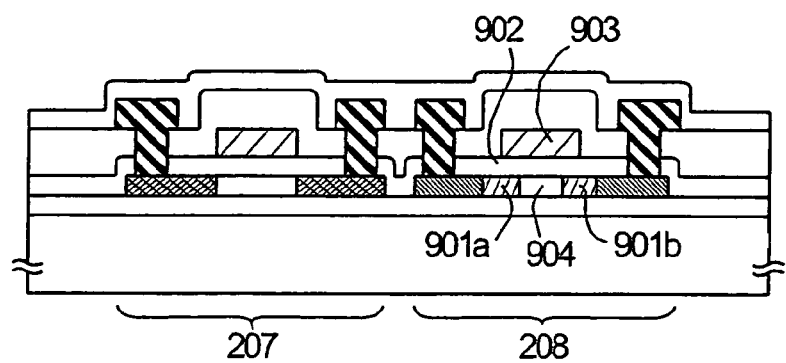
FIG. 9 is a view showing an element structure of a sampling circuit.

Accordingly, it is desirable that, as the n-channel type TFT forming the sampling circuit, a TFT structured as illustrated in FIG. 9 is arranged. As illustrated in FIG. 9, parts of LDD regions 901a and 901b overlap a gate electrode 903 through a gate insulating film 902. The purpose is to take measures against deterioration due to hot carrier injection caused when electric current flows therethrough. The case of the sampling circuit is different from other cases in that such LDD regions are provided on both sides so as to sandwich a channel forming region 904.

Note that, actually, after the process illustrated in FIG. 8C is completed, the device is preferably packaged (enclosed) in a covering material such as airtight glass, quartz, or plastic so that the device is not exposed to the outside air. In this case, a hygroscopic agent such as barium oxide or an antioxidant is preferably disposed inside the covering material.

Further, after the airtightness is enhanced by processing such as the packaging, a connector (flexible print circuit: FPC) for connecting terminals led from elements or circuits formed on the substrate to external signal terminals is attached to complete the device as a product. The device in this state, i.e., in a shippable state is herein referred to as an EL display device (or EL module).

Here, the structure of the active matrix EL display device according to the present embodiment is described with reference to a perspective view of FIG. 10. The active matrix EL display device according to the present embodiment includes a pixel portion 602, a gate side driver circuit 603, and a source side driver circuit 604 formed on a glass substrate 601. A switching TFT 605 in the pixel portion is an n-channel type TFT, and is disposed at an intersection of a gate wiring 606 connected to the gate side driver circuit 603 and a source wiring 607 connected to the source side driver circuit 604. A drain of the switching TFT 605 is connected to a gate of an electric current controlling TFT 608.

Further, a source side of the electric current controlling TFT 608 is connected to a power supply line 609. In a structure of this embodiment, the power supply line 609 has a ground potential (an earth potential). Further, a drain of the electric current controlling TFT 608 is connected to an EL element 610. A given voltage (3 to 12 V, preferably 3 to 5 V) is applied to an anode of the EL element 610.

Further, an FPC 611 that becomes an external input/output terminal is provided with connection wirings 612 and 613 for transmitting a signal to a driver circuit portion, and a connection wiring 614 connected to the power supply line 609.

Figure 10:
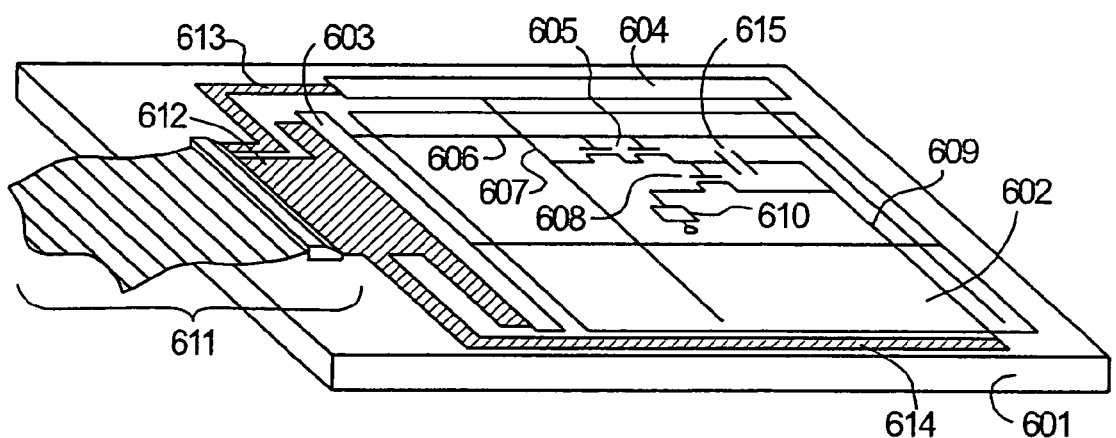
FIG. 10 is a view showing an appearance of the EL display device.
Figure 11:
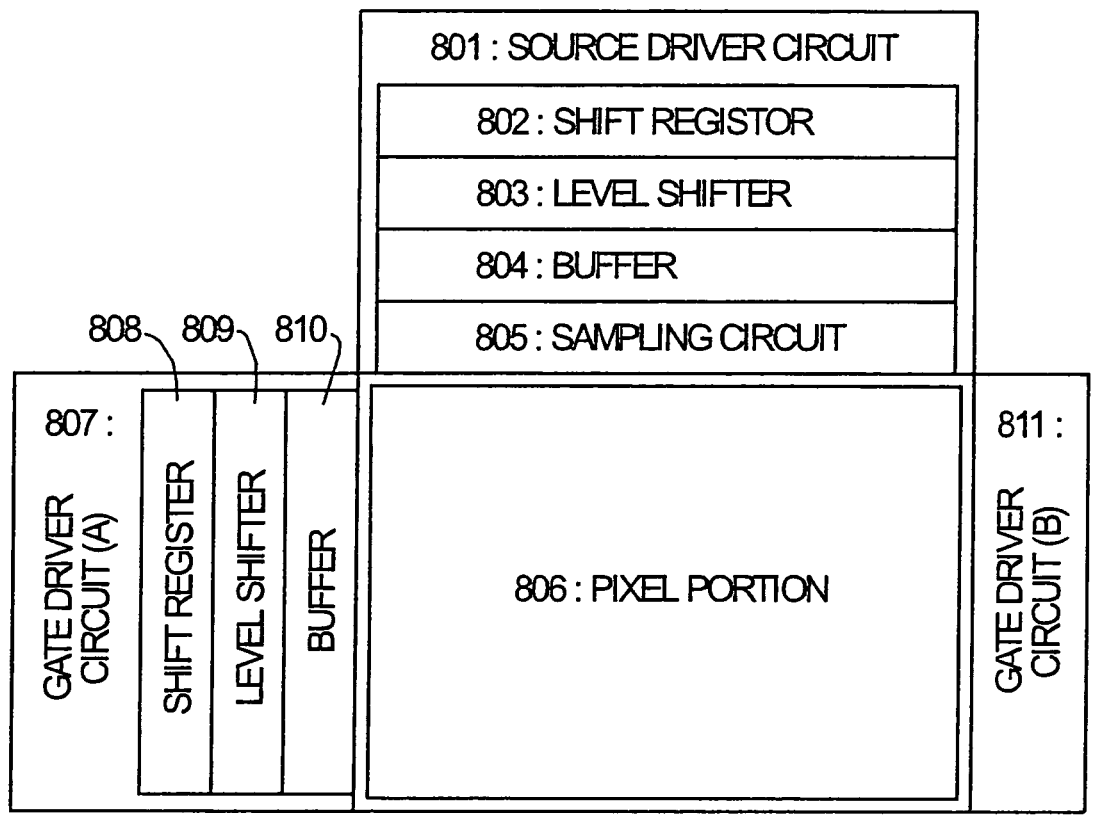
FIG. 11 is a diagram showing a circuit block structure of the EL display device.

Also, FIG. 11 illustrates an example of a circuit structure of the EL display device illustrated in FIG. 10. The EL display device according to the present embodiment has a source side driver circuit 801, a gate side driver circuit (A) 807, a gate side driver circuit (B) 811, and a pixel portion 806. Note that the driver circuit portion as used herein is a generic name, and includes the source side driver circuit and the gate side driver circuit.

The source side driver circuit 801 is provided with a shift register 802, a level shifter 803, a buffer 804, and a sampling circuit (sample-and-hold circuit) 805. Further, the gate side driver circuit (A) 807 is provided with a shift register 808, a level shifter 809, and a buffer 810. The gate side driver circuit (B) 811 is similarly structured.

In this case, the driving voltage of the shift registers 802 and 808 is 5 to 16 V (representatively 10 V). For an n-channel type TFT used in a CMOS circuit that constructs the circuit, the structure denoted as 205 in FIG. 8C is suitable.

Similarly to the case of the shift registers, for the level shifters 803 and 809 and the buffers 804 and 810, a CMOS circuit including the n-channel type TFT 205 illustrated in FIG. 8C is suitable. Note that to make the gate wirings have a multi-gate structure such as a double-gate structure or a triple-gate structure is effective in improving the reliability of the respective circuits.

In addition, with regard to the sampling circuit 805, since the source region and the drain region are reversed and, in addition, it is necessary to lower the off current value, a CMOS circuit including an n-channel type TFT 208 illustrated in FIG. 9 is suitable.

Also, in the pixel portion 806, pixels structured as illustrated in FIG. 2 are arranged.

Note that the above structure can be easily materialized by manufacturing the TFTs according to the manufacturing process illustrated in FIGS. 6 to 8. Further, though only the structure of the pixel portion and the driver circuit portion are illustrated in this embodiment, according to the manufacturing process of the present embodiment, logic circuits other than the driver circuit such as a signal division circuit, a D/A converter circuit, an operational amplifier circuit, and a γ correction circuit can also be formed on the same substrate. Further, it is expected that a memory unit, a microprocessor, and the like can also be formed.

Further, the EL module according to the present embodiment including a covering material is described with reference to FIGS. 12A and 12B. The reference numerals used in FIGS. 10 and 11 are also used here as necessity requires.

FIG. 12A is a top view illustrating a state illustrated in FIG. 10 with a sealing structure provided therewith. 602, 603, and 604 shown by dashed lines denote a pixel portion, a gate side diver circuit, and a source side driver circuit, respectively. The sealing structure according to the present invention is a structure provided with a filling agent (not shown), a covering material 1101, a sealing material (not shown), and a frame material 1102 for the state illustrated in FIG. 10.

Here, FIG. 12B is a sectional view taken along the line A-A' of FIG. 12A. Note that like reference numerals denote like parts in FIGS. 12A and 12B.

As illustrated in FIG. 12B, the pixel portion 602 and the gate side driver circuit 603 are formed on the substrate 601. The pixel portion 602 is formed of a plurality of pixels including the electric current controlling TFT 202 and the pixel electrode 348 electrically connected thereto. The gate side driver circuit 603 is formed using a CMOS circuit where the n-channel type TFT 205 and the p-channel type TFT 206 are complementarily combined.

The pixel electrode 348 functions as an anode of the EL element. Also, the protective film 349a is formed at both ends of the pixel electrode 348. The EL layer 350 and the cathode 351 are formed on the protective film 349a. Further, the protective electrode 352 and the second passivation film 353 are formed thereon. As described in the above Embodiment Mode, the structure of the EL element may be reversed and the pixel electrode may be the cathode.

In this embodiment, the protective electrode 352 also functions as a wiring, which is common to all the pixels, and is electrically connected to the FPC 611 via the connection wiring 612. Further, all elements included in the pixel portion 602 and the gate side driver circuit 603 are covered with the second passivation film 353. Though the second passivation film 353 may be omitted, it is preferable to provide it so as to block the respective elements from the external.

Then, a filling agent 1103 is provided so as to cover the EL elements. The filling agent 1103 also functions as adhesive for adhering the covering material 1101. As the filling agent 1103, PVC (polyvinyl chloride), an epoxy resin, a silicone resin, PVB (polyvinyl butyral), or EVA (ethylene vinyl acetate) can be used. It is preferable to provide a hygroscopic agent (not shown) inside the filling agent 1103, because the hygroscopic effect can be maintained. In this case, the hygroscopic agent may be one added to the filling agent, or may be one enclosed in the filling agent.

Further, in this embodiment, as the covering material 1101, glass, plastic, or ceramics can be used. Note that to add in advance a hygroscopic agent such as barium oxide inside the filling agent 1103 is effective.

Then, after the covering material 1101 is adhered using the filling agent 1103, the frame material 1102 is attached so as to cover the side surfaces (exposed surfaces) of the filling agent 1103. The frame material 1102 is adhered by a sealing material (which functions as adhesive) 1104. In this case, as the sealing material 1104, though a photo-curable resin is preferably used, if the heat resistance of the EL layer permits, a thermosetting resin may also be used. Note that the sealing material 1104 is preferably a material that transmits moisture and oxygen as less as possible. Further, a hygroscopic agent may be added to the inside of the sealing material 1104.

By encapsulating the EL element in the filling agent 1103 using the above-mentioned method, the EL element can be completely blocked from the external, with the result that substances such as moisture and oxygen which promote deterioration of the EL layer due to oxidation can be prevented from entering. Accordingly, an EL display device with high reliability can be manufactured.

Embodiment 2

In Embodiment 1, a manufacturing method is described where, after the organic resin is coated to the whole surface above the pixel electrode, patterning is performed using an exposing unit, the partial protective portions are formed where the organic resin fills up the electrode hole and the space between pixel electrodes, and then, the EL layer is formed. However, since there is the exposure process, the throughput is insufficient. In this embodiment, a method is described where, after an organic resin is coated to the whole surface above a pixel electrode, without performing patterning, planarization is performed using etch back, and then, portions other than an organic resin filling up an electrode hole and a space between pixel electrodes, are etched.

Here, FIG. 13 illustrates the structure in cross section of a pixel portion of an EL display device according to the present invention.

Figure 13A:
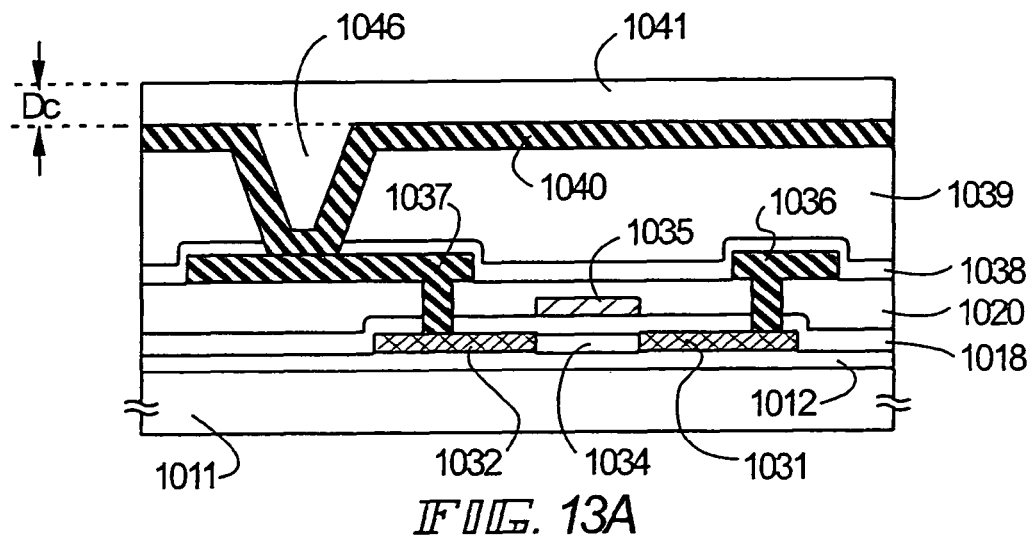

FIG. 13A illustrates a pixel electrode 1040 and an electric current controlling TFT which is electrically connected to the pixel electrode 1040. After a baser film 1012 is formed on a substrate 1011, the electric current controlling TFT is formed so as to have an active layer including a source region 1031, a drain region 1032, and a channel forming region 1034, a gate insulating film 1018, a gate electrode 1035, a first interlayer insulating film 1020, a source wiring 1036, and a drain wiring 1037. Note that, though the gate electrode 1035 is of a single-gate structure in the figure, it may be of a multi-gate structure.

Then, a first passivation film 1038 is formed at the thickness of 10 nm to 1 μm (preferably 200 to 500 nm). As the material, an insulating film containing silicon (especially, a silicon oxynitride film or a silicon nitride film is preferable) can be used.

A second interlayer insulating film (which may also be referred to as planarizing film) 1039 is formed on the first passivation film 1038 so as to cover the respective TFTs to planarize a step formed by the TFTs. As the second interlayer insulating film 1039, an organic resin film of such as a polyimide resin, a polyamide resin, an acrylic resin, or a resin containing a high molecular compound of siloxane is preferable. Of course, an inorganic film may also be used if it can perform sufficient planarization.

It is quite important to planarize, by the second interlayer insulating film 1039, a step formed by the TFTs. Since an EL layer to be formed later is very thin, existence of a step may cause failure light emission. Therefore, it is preferable that planarization is performed prior to the formation of the pixel electrode in order to make as planar as possible the surface on which the EL layer is formed.

Further, after a contact hole (an opening) is formed in the second interlayer insulating film 1039 and the first passivation film 1038, a pixel electrode 1040 (corresponding to an anode of the EL element) of a transparent conductive film is formed so as to be connected at the formed opening to the drain wiring 1037 of the electric current controlling TFT.

In this embodiment, as the pixel electrode, a conductive film formed of a compound of indium oxide and tin oxide is used. A small amount of gallium may be doped into the compound. Further, a compound of indium oxide and zinc oxide may be used.

Then, an organic resin film 1041 of an organic resin is formed on the pixel electrode. As the organic resin, though materials such as a polyamide resin, a polyimide resin, an acrylic resin, and a resin containing a high molecular compound of siloxane may be used, here, an acrylic resin such as acrylic ester resin, acrylate resin, methacrylic acid ester resin, or methacrylic acid resin is used.

Note that a resin containing a high molecular compound of siloxane includes CYCLOTEN.

Further, though, in this case, the organic resin film of an organic resin is formed on the pixel electrode, an insulator which can be an insulating film may be used.

As the insulator, an insulating film containing silicon such as silicon oxide, silicon oxynitride, or silicon nitride may be used.

The thickness (Dc) of the organic resin film 1041 is preferably 0.1 to 2 μm, and more preferably, 0.2 to 0.6 μn.

After the organic resin film 1041 is formed, the whole surface of the organic resin film 1041 is etched until Dc=0 is attained. At that point, the etching is completed. In this way, the acrylic resin filling up the electrode hole is left to form a protective portion 1041b.

Note that, as the etching method, dry etching is preferable. First, etching gas suitable for the organic resin material to be etched is introduced into a vacuum chamber. Thereafter, high frequency voltage is applied to an electrode to generate plasma of the etching gas.

In the plasma of the etching gas, charged particles such as positive ions, negative ions, and electrons, and neutral active species exist scatteringly. When the etching species are adsorbed by the etched material, chemical reaction is caused on the surface, and an etching product is generated. By removing the etching product, the etching is performed.

Further, when an acrylic resin is used as the material of the protective film, preferably the etching gas containing oxygen as the main component is used.

Note that, in this embodiment, etching gas made of oxygen, helium, and carbon tetrafluoride ($CF_4$) is used as the etching gas containing oxygen as the main component. As other materials, gas containing fluorocarbon such as carbon hexafluoride may be used.

Note that, in those etching gases, it is preferable that oxygen is 60% or more of the whole etching gas.

Figure 13B:
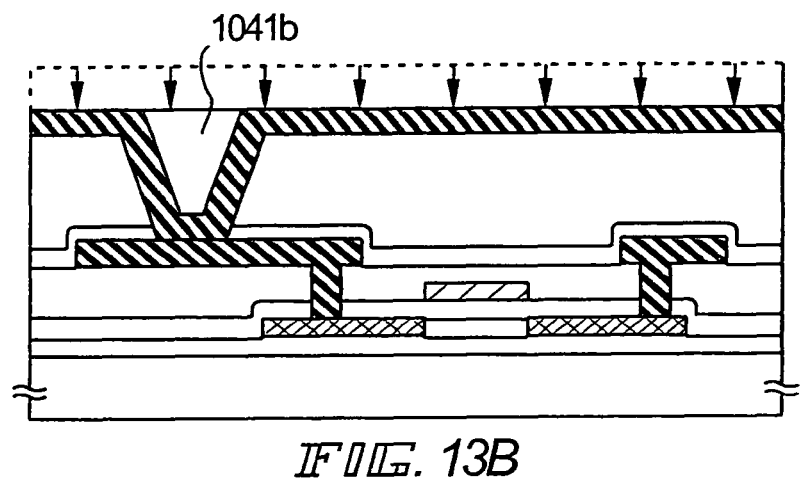

As illustrated in this embodiment, after the organic resin film is formed on the pixel electrode by spin coating, the whole surface is etched in the direction shown by arrows in FIG. 13B so that a protective portion 1041b is formed in an electrode hole 1046. Note that, as illustrated in FIG. 13B, an exposed surface of the protective portion 1041b formed here is flush with an exposed surface of the pixel electrode 1040.

Note that the etching rate is examined in advance, and the etching time is set such that the etching ends just when the organic resin film on the pixel electrode 1040 is removed except the protective portion 1041b. In this way, the upper surface of the pixel electrode 1040 is flush with the upper surface of the protective portion 1041b.

Further, when these organic resins are used, the viscosity of the organic resin is preferably $10^{-3}$ Pa·s to $10^{-1}$ Pa·s.

Figure 13C:
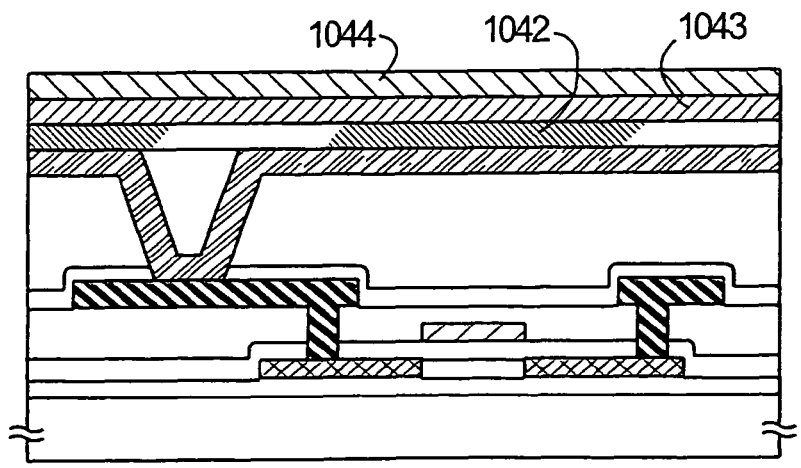

After the protective portion 1041b is formed, as illustrated in FIG. 13C, an EL material dissolved in a solvent is applied by spin coating to form an EL layer 1042.

After the EL layer 1042 is formed, a cathode 1043 and a protective electrode 1044 are further formed.

By forming the structure illustrated in FIG. 13C as in the above, the problem of the short circuit between the pixel electrode 1040 and the cathode 1043 caused when the EL layer 1042 is disconnected at a step portion in the electrode hole can be solved.

FIG. 13D is a top view in case that the protective portion 1041b on the pixel electrode 1040 is in the same shape as that of the electrode hole 1046 as described in this embodiment.

Further, the structure of the present embodiment can be freely combined with the structure of Embodiment 1.

Embodiment 3

In Embodiment 2, a method of forming the protective film by etching, that is, an etch back method is described. However, since the etch back method may be inappropriate depending on the kind of the protective film, and the range which can be planarized by the etch back method is limited from several μm to several tens μm, formation of a protective portion using chemical mechanical polishing (CMP) is also considered. Such a method is now described also with reference to FIG. 13.

In this embodiment, after the organic resin film 1041 is formed at the thickness of Dc (>0) as illustrated in FIG. 13A of Embodiment 2, the organic resin film 1041 is pressed against a polishing pad extended on a surface plate opposed to the organic resin film 1041 under constant pressure, and abrasive (slurry) is made to flow therebetween with the substrate and the surface plate being rotated to polish the organic resin film 1041 until Dc=0 is attained. Using such a method, which is so-called CMP, the protective portion 1041b is formed.

The slurry used in the CMP is formed by dispersing polishing particles called abrasive in an aqueous solution after pH control. It is preferable that the slurry is changed depending on the polished film.

In this embodiment, since an acrylic resin is used as the polished film, slurry such as one containing silica ($SiO_2$), one containing ceria ($CeO_2$), or one containing fumed silica ($SiCl_4$) is preferably used. However, other slurries such as one containing alumina ($Al_2O_3$) or one containing zeolite may also be used.

Further, since the electric potential (zeta potential) between the liquid and the abrasive (silica particles) in the slurry influences the processing accuracy, the zeta potential is required to be controlled by optimizing the pH value.

When polishing is performed using CMP, it is difficult to ascertain when the polishing is to be ended. If too much polishing is performed, even the pixel electrode is polished. By forming a film the processing speed of which is extremely slow as a stopper of the CMP, or, by adopting a method where the relation between the processing time and the processing speed is clarified in advance by experiment and the CMP is ended when predetermined processing time elapses, too much polishing can be prevented.

As described in the above, by using the CMP, the protective portion 1041b can be formed irrespective of the thickness and the kind of the polished film.

Note that the structure of the present embodiment can be freely combined with the structures of Embodiments 1 and 2.

Embodiment 4

In this embodiment, a case where the present invention is used in a passive type (simple matrix type) EL display device is described with reference to FIG. 14.

In FIG. 14, a substrate 1301 is formed of plastic and an anode 1306 is formed of a transparent conductive film. Note that the substrate 1301 may be formed of glass, quartz, or the like.

In this embodiment, as the transparent conductive film, a compound of indium oxide and zinc oxide is formed by vapor deposition. Note that, though not shown in FIG. 14, a plurality of anodes are arranged to be stripe-like in a direction perpendicular to the plane of the figure.

Further, protective portions 1303 according to the present invention are formed so as to fill up spaces between the anodes 1302 arranged to be stripe-like. The protective portions 1303 are formed along the anodes 1302 in the direction perpendicular to the plane of the figure. Note that the protective portions 1303 of the present embodiment may be formed according to the methods described in Embodiments 1 to 3 using a similar material.

Then, an EL layer 1304 of a high molecular organic EL material is formed. The organic EL material used may be similar to the one described in Embodiment 1. Since the EL layer is formed along grooves formed by the protective portions 1303, the EL layer is also arranged to be stripe-like along the direction perpendicular to the plane of the figure.

After that, though not shown in FIG. 14, a plurality of cathodes and protective electrodes are arranged to be stripe-like with their longitudinal direction being in parallel to the plane of the figure so as to be orthogonal with respect to the anodes 1302. Note that, in this embodiment, the cathodes 1305 are formed of MgAg by vapor deposition and the protective electrodes 1306 are formed of an aluminum alloy film by vapor deposition. Further, though not shown in the figure, wirings are led from the protective electrodes 1306 to portions where an FPC is to be attached later, such that predetermined voltage is applied to the protective electrodes 1306.

Further, though not shown in the figure, after the protective electrodes 1306 are formed, a silicon nitride film may be provided as a passivation film.

In this way, EL elements are formed on the substrate 1301. Note that, in this embodiment, since the lower electrodes are anodes which transmit light, light emitted from the EL layers 1304a to 1304c are radiated to the lower surface (substrate 1301). However, the structure of the EL elements may be reversed and the lower electrodes may be cathodes which block light. In this case, light emitted by the EL layers are radiated to the upper surface (the side opposite to the substrate 1301).

Then, a ceramic substrate is prepared as a covering material 1307. Though, in the structure of the present embodiment, a ceramic substrate which blocks light is used, if the structure of the EL elements is reversed as described in the above, of course it is preferable that the covering material transmits light, and thus, in that case, a substrate formed of plastic, glass, or the like is used.

After the covering material 1307 is thus prepared, the covering material 1307 is adhered by a filling agent 1308 with barium oxide being added as a hygroscopic agent (not shown). After that, a frame material 1310 is attached using a sealing material 1309 formed of an ultraviolet curable resin. In this embodiment, stainless steel is used as the frame material 1310. Finally, an FPC 1312 is attached through an anisotropic conductive film 1311 to complete the passive type EL display device.

Note that the structure of the present embodiment can be freely combined with any structures of Embodiments 1 to 3.

Embodiment 5

It is effective to use a silicon substrate (silicon wafer) as a substrate when an active matrix EL display device is manufactured according to the present invention. When a silicon substrate is used as the substrate, elements for switching and elements for controlling electric current which are formed in a pixel portion and elements for driving which are formed in a driver circuit portion can be formed using a known technology for manufacturing MOSFETs used in ICs and LSIs.

MOSFETs can form a circuit with extremely small fluctuation, as can be seen in a known IC or LSI. In particular, MOSFETs are effective in forming an analog-driven active matrix EL display device, which represents gray scale by the electric current value.

Note that, since the silicon substrate blocks light, it is necessary that the device is structured such that light from the EL layer is radiated to the side opposite to the substrate. The EL display device according to the present embodiment is similar in structure to the one illustrated in FIG. 12, but is different in that MOSFETs are used instead of the TFTs forming the pixel portion 602 and the driver circuit portion 603.

Note that the structure of the present embodiment can be freely combined with any structures of Embodiments 1 to 4.

Embodiment 6

An EL display device formed by implementing the present invention is a self-light-emitting type, and has a superior visibility in a bright location in comparison with a liquid crystal display device, and also has a wide angle of view. Therefore it can be used as a display portion of various electronic equipment. For example, the self-light-emitting device of the present invention may be used in the display portion of a 30 inch or larger (typically 40 inch or larger) diagonal EL display (display incorporating EL display device in the housing) for appreciation of a TV broadcast or the like by a large screen.

Note that all display devices for displaying information such as a personal computer display, a display for receiving TV broadcasts, and a display for displaying advertisements, are included in EL displays. Further, the self-light-emitting device of the present invention can also be used in the display portion of various other electronic equipment.

The following can be given as this type of electronic equipment of the present invention: a video camera; a digital camera; a goggle type display (head mounted display); a navigation system; an audio playback device (such as a car audio system or an audio component system); a notebook type personal computer; a game apparatus; a portable information terminal (such as a mobile computer, a cellular phone, a portable game machine, or an electronic book); and an image playback device equipped with a recording medium (specifically, device prepared with a display which plays back a recording medium such as a digital video disk (DVD) and displays that image). In particular, a wide angle of view is important for a portable information terminal often seen from an oblique angle, and therefore it is preferable to use an EL display. Specific examples of those electronic devices are shown in FIGS. 15A to 15F and FIGS. 16A and 16ab.

Figure 15A:
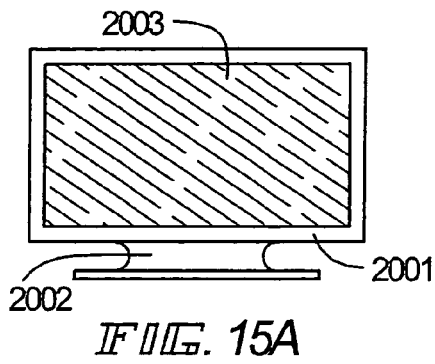
FIGS. 15A to 15F are views showing specific examples of electric equipment.

FIG. 15A is an EL display, and includes a frame 2001, a support stand 2002, and a display portion 2003, etc. The present invention can be used in the display portion 2003. The EL display is a self-light-emitting type, and therefore a back light is not necessary, and the display portion can be made thinner than that of a liquid crystal display device.

Figure 15B:
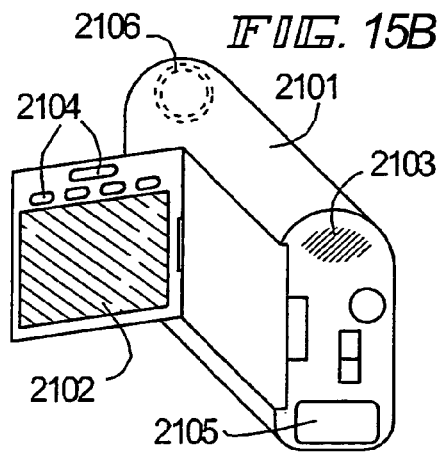

FIG. 15B is a video camera, and includes a main body 2101, a display portion 2102, a sound input portion 2103, operation switches 2104, a battery 2105, an image receiving portion 2106, etc. The EL display device of the present invention can be used in the display portion 2102.

Figure 15C:
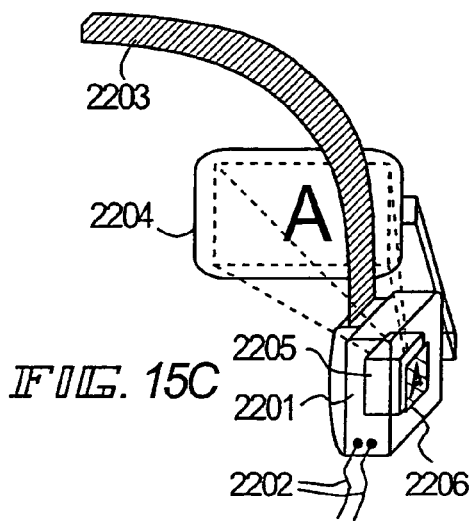

FIG. 15C is a portion (right side) of a head mounted EL display, and includes a main body 2201, a signal cable 2202, a head fixing band 2203, a display portion 2204, an optical system 2205, EL display device 2206, etc. The present invention can be used in the EL display portion 2206.

Figure 15D:
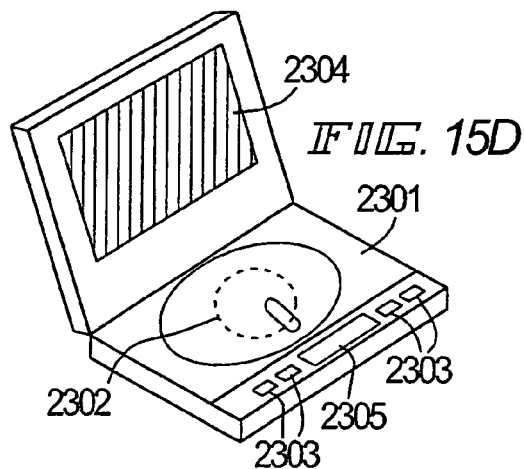

FIG. 15D is an image playback device equipped with a recording medium (specifically, a DVD playback device), and includes a main body 2301, a recording medium (such as a DVD) 2302, operation switches 2303, a display portion (a) 2304, and a display portion (b) 2305, etc. The display portion (a) 3334 is mainly used for displaying image information, and the display portion (b) is mainly used for displaying character information, and the EL display device of the present invention can be used in the display portion (a) and for the display portion (b). Note that the image playback device equipped with the recording medium includes devices such as household game machines.

Figure 15E:
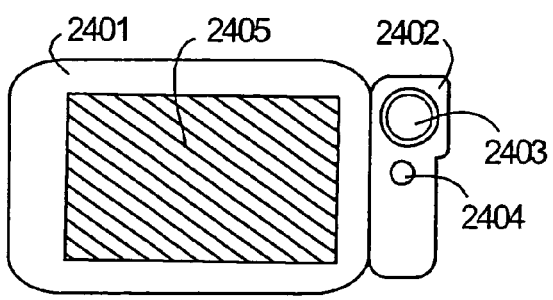

FIG. 15E is a portable (mobile) computer, and includes a main body 2401, a camera portion 2402, an image receiving portion 2403, operation switches 2404, and a display portion 2405. The EL display device of the present invention can be used in the display portion 2405.

Figure 15F:
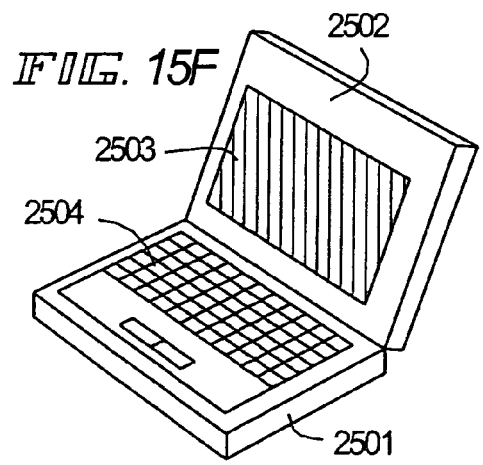

FIG. 15F is a personal computer, and includes a main body 2501, a frame 2502, a display portion 2503, and a keyboard 2504. The EL display device of the present invention can be used in the display portion 2503.

Note that if the brightness of light emitted by EL materials increases in the future, then it will become possible to use in a front type or a rear type projector to expand and project light containing output image information with a lens or the like.

Further, the above electronic devices often display information distributed through an electronic communication network such as the Internet and a CATV (cable television). In particular, there are more and more opportunities that the electronic devices display dynamic image information. Since the response speed of an EL material is very high, an EL display device is suitable for dynamic image display. However, if outlines between pixels are blurred, the whole dynamic image is blurred. Therefore, it is quite effective to use, as a display portion of an electronic devices, the EL display device according to the present invention which clears outlines between pixels.

In addition, since the EL display device consumes power in the light emitting portion, it is therefore preferable to use the EL display device for displaying information so as to make the light emitting portions as few as possible. Consequently, when using the EL display device in a display portion mainly for character information, such as in a portable information terminal, in particular a cellular phone or an audio playback device, it is preferable to drive so as to form character information by the light emitting portions while non-light emitting portions are set as background.

Figure 16A:
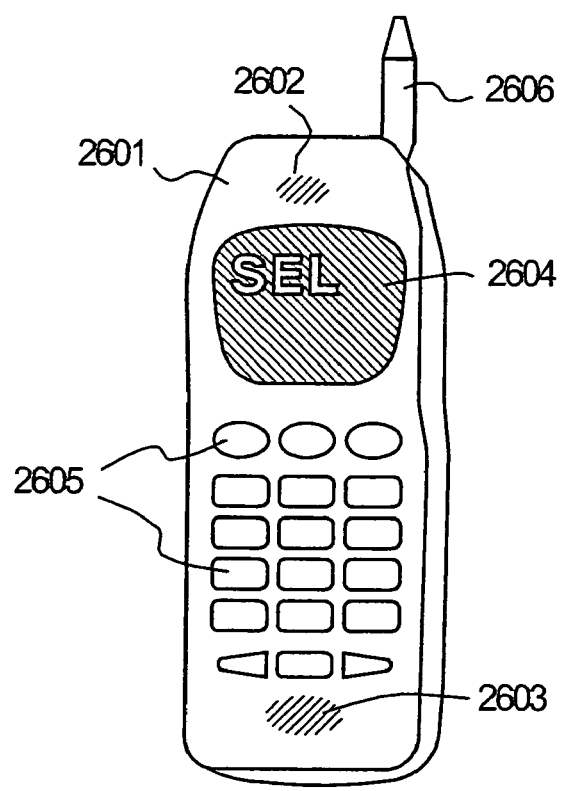
FIGS. 16A and 16B are views showing specific examples of electric equipment

FIG. 16A is a cellular phone, and includes a main body 2601, a sound output portion 2602, a sound input portion 2603, a display portion 2604, operation switches 2605, and an antenna 2606. The EL display device of the present invention can be used in the display portion 2604. Note that by displaying white color characters in a black color background, the display portion 2604 can suppress the power consumption of the cellular phone.

Figure 16B:
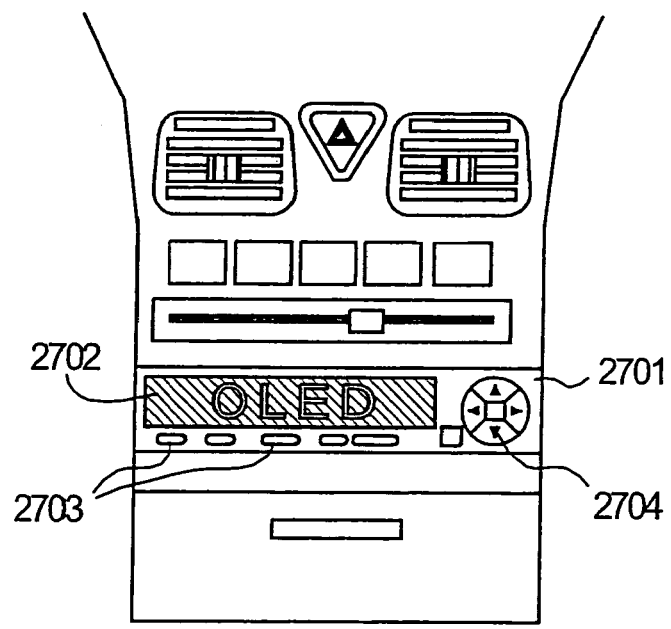

FIG. 16B is an audio playback device, specifically a car audio system, and includes a main body 2701, a display portion 2702, and operation switches 2703 and 2704. The EL display device of the present invention can be used in the display portion 2702. Further, a car audio system is shown in this embodiment, but the EL display device of the present invention can be used in a portable type or a household audio playback system, too. Note that by displaying white color characters in a black color background, the display portion 2704 can suppress the power consumption. This is especially effective in a portable type audio playback device.

The applicable range of the present invention is thus extremely wide, and it is possible to apply the present invention to electric equipment in all fields. Also, the electric equipment in this embodiment can also be realized by using any EL display device structured in Embodiments 1 to 5.

Embodiment 7

In an EL element manufactured by using the present invention, it is also possible to use an EL material which can use phosphorescence from triplet excitation for light emission. A light-emitting device using an EL material, which can use phosphorescence for light emission can drastically improve the external light emission quantum efficiency. This makes it possible to lower the power consumption, prolong the life, and lighten the weight, of the EL element.

The following papers report that the external light emission quantum efficiency is improved using triplet exciton.

The structural formula of an EL material (coumarin pigment) reported by T. Tsutsui, C. Adachi, and S. Saito in Photochemical Processes in Organized Molecular Systems, ed. K Honda (Elsevier Sci. Pub., Tokyo, 1991), p. 437 is as follows:

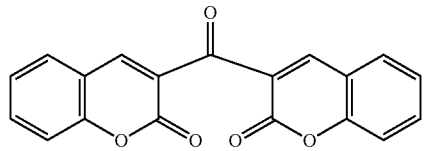

The structural formula of an EL material (Pt complex) reported by M. A. Baldo, D. F. O'Brien, Y. You, A. Shoustikov, S. Sibley, M. E. Thompson, and S. R. Forrest in Nature 395 (1998), p. 151 is as follows:

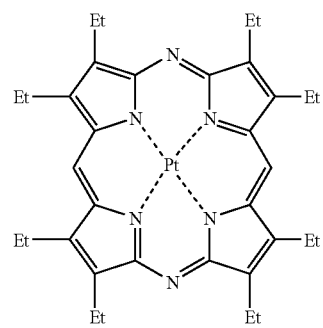

The structural formula of an EL material (Ir complex) reported by M. A. Baldo, S. Lamansky, P. E. Burrows, M. E. Thompson, and S. R. Forrest in Appl. Phys. Lett., 75 (1999), p. 4, and by T. Tsutsui, M. J. Yang, M. Yahiro, K. Nakamura, T. Watanabe, T. Tsuji, Y. Fukuda, T. Wakimoto, and S. Mayaguchi in Jpn. Appl. Phys., 38 (12B) (1999) L1502 is as follows:

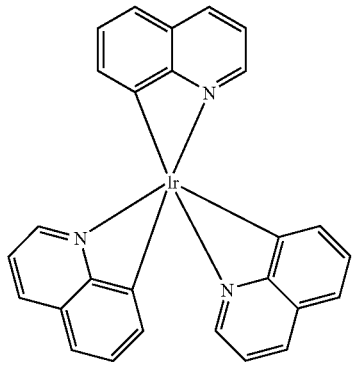

If the above phosphorescence from triplet exciton can be used, in principle, external light emission quantum efficiency, which is three to four times as much as that when fluorescence from singlet exciton is used, can be materialized.

Note that the structure of the present embodiment can be freely combined with any structures of Embodiments 1 to 6.

According to the present invention, failure film formation of an electrode hole caused when a film of an organic EL material is formed can be improved. Further, according to the present invention, since the electrode hole can be filled up with a protective portion in various methods and in various shapes, film formation according to the conditions and the purpose can be performed, and failure light emission of an EL layer due to short circuit between a cathode and an anode can be prevented.

Although the present invention has been disclosed in conjunction with the preferred embodiments of the invention, the present invention should not be limited to the particular embodiments. For example, the present invention may be applied to an EL device having a different type of switching elements or a circuit for driving the EL elements.

What is claimed is:

1. A portable information terminal comprising:
a display portion comprising,
a TFT;
an interlayer insulating film over the TFT;
a pixel electrode over the interlayer insulating film;
a light emitting layer over the pixel electrode; and
a counter electrode over the light emitting layer,
wherein the pixel electrode comprises an electrode hole which is filled up with an insulator comprising an organic resin,
wherein the pixel electrode is connected to the TFT, and
wherein at least a portion of an upper surface of the insulator is overlapped with the light emitting layer.

2. A portable information terminal according to claim 1, wherein a surface of the pixel electrode and a surface of the insulator are planarized to be flush with each other.

3. A portable information terminal according to claim 1, wherein a thickness of a portion of the insulator higher than a top surface of the pixel electrodes is 0.1 to 1µm.

4. A portable information terminal according to claim 1, wherein the light emitting layer comprises an organic material.

5. A portable information terminal according to claim 4, wherein the organic resin comprises a material selected from the group consisting of acrylic resin, polyimide resin, polyamide resin.

6. A portable information terminal according to claim 4, wherein the organic resin comprises a resin containing a high molecular compound of siloxane.

7. A portable information terminal according to claim 4, wherein a viscosity of the organic resin is $10^{-3}$ Pa·s to $10^{-1}$ Pa·s.

8. A portable information terminal according to claim 1, wherein the insulator in the electrode hole is sandwiched between the pixel electrode and the light emitting layer.

9. A portable information terminal according to claim 1, wherein the light emitting layer is also formed over a surface of the insulator.

10. A portable information terminal according to claim 1, wherein the light emitting layer and the insulator are sandwiched between the pixel electrode and the counter electrode.

11. A portable information terminal according to claim 1, wherein the counter electrode is a cathode and the pixel electrode is an anode.

12. A portable information terminal according to claim 1, wherein the counter electrode is an anode and the pixel electrode is a cathode.

13. A portable information terminal according to claim 1, wherein the information terminal is selected from the group consisting of a mobile computer, a cellular phone, a portable game machine and an electronic book.

14. A portable information terminal comprising:
a display portion comprising,
an electric current controlling element;
a first interlayer insulating film formed over the electric current controlling element;
a second interlayer insulating film over the first interlayer insulating film;
a contact hole opened in the second interlayer insulating film;
a pixel electrode formed over the second interlayer insulating film and electrically connected to the electric current controlling element through the contact hole;
an insulator comprising an organic resin formed over a portion of the pixel electrode in the contact hole;
a light emitting layer formed over the pixel electrode and the insulator; and
an electrode formed over the light emitting layer,
wherein at least a portion of an upper surface of the insulator is overlapped with the light emitting layer.

15. A portable information terminal according to claim 14, wherein the electric current controlling element includes a transistor formed within a silicon substrate.

16. A portable information terminal according to claim 14, wherein the pixel electrode is an anode while the electrode is a cathode.

17. A portable information terminal according to claim 14, wherein the pixel electrode is a cathode while the electrode is an anode.

18. A portable information terminal according to claim 14, wherein a surface of the pixel electrode and a surface of the insulator are planarized to be flush with each other.

19. A portable information terminal according to claim 14, wherein a thickness of a portion of the insulator higher than a top surface of the pixel electrodes is 0.1 to 1µm.

20. A portable information terminal according to claim 14, wherein the light emitting layer comprises an organic material.

21. A portable information terminal according to claim 20, wherein the organic resin comprises a material selected from the group consisting of acrylic resin, polyimide resin, polyamide resin.

22. A portable information terminal according to claim 20, wherein the organic resin comprises a resin containing a high molecular compound of siloxane.

23. A portable information terminal according to claim 20, wherein a viscosity of the organic resin is $10^{-3}$ Pa·s to $10^{-1}$ Pa·s.

24. A portable information terminal according to claim 14, wherein the information terminal is selected from the group consisting of a mobile computer, a cellular phone, a portable game machine and an electronic book.

25. An audio playback device comprising:
a display portion comprising,
a TFT;
an interlayer insulating film over the TFT;
a pixel electrode over the interlayer insulating film;
a light emitting layer over the pixel electrode; and
a counter electrode over the light emitting layer,
wherein the pixel electrode comprises an electrode hole which is filled up with an insulator comprising an organic resin,
wherein the pixel electrode is connected to the TFT, and
wherein at least a portion of an upper surface of the insulator is overlapped with the light emitting layer.

26. An audio playback device according to claim 25, wherein a surface of the pixel electrode and a surface of the insulator are planarized to be flush with each other.

27. An audio playback device according to claim 25, wherein a thickness of a portion of the insulator higher than a top surface of the pixel electrodes is 0.1 to 1μm.

28. An audio playback device according to claim 25, wherein the light emitting layer comprises an organic material.

29. An audio playback device according to claim 28, wherein the organic resin comprises a material selected from the group consisting of acrylic resin, polyimide resin, polyamide resin.

30. An audio playback device according to claim 28, wherein the organic resin comprises a resin containing a high molecular compound of siloxane.

31. An audio playback device according to claim 28, wherein a viscosity of the organic resin is $10^{-3}$ Pa·s to $10^{-1}$ Pa·s.

32. An audio playback device according to claim 25, wherein the insulator in the electrode hole is sandwiched between the pixel electrode and the light emitting layer.

33. An audio playback device according to claim 25, wherein the light emitting layer is also formed over a surface of the insulator.

34. An audio playback device according to claim 25, wherein the light emitting layer and the insulator are sandwiched between the pixel electrode and the counter electrode.

35. An audio playback device according to claim 25, wherein the counter electrode is a cathode and the pixel electrode is an anode.

36. An audio playback device according to claim 25, wherein the counter electrode is an anode and the pixel electrode is a cathode.

37. An audio playback device according to claim 25, wherein the audio playback device is selected from the group consisting of a car audio system, and an audio component system.

38. An audio playback device comprising:
a display portion comprising,
an electric current controlling element;
a first interlayer insulating film formed over the electric current controlling element;
a second interlayer insulating film over the first interlayer insulating film;
a contact hole opened in the second interlayer insulating film;
a pixel electrode formed over the second interlayer insulating film and electrically connected to the electric current controlling element through the contact hole;
an insulator comprising an organic resin formed over a portion of the pixel electrode in the contact hole;
a light emitting layer formed over the pixel electrode and the insulator; and
an electrode formed over the light emitting layer,
wherein at least a portion of an upper surface of the insulator is overlapped with the light emitting layer.

39. An audio playback device according to claim 38, wherein the electric current controlling element includes a transistor formed within a silicon substrate.

40. An audio playback device according to claim 38, wherein the pixel electrode is an anode while the electrode is a cathode.

41. An audio playback device according to claim 38, wherein the pixel electrode is a cathode while the electrode is an anode.

42. An audio playback device according to claim 38, wherein a surface of the pixel electrode and a surface of the insulator are planarized to be flush with each other.

43. An audio playback device according to claim 42, wherein the audio playback device is selected from the group consisting of a car audio system, and an audio component system.

44. An audio playback device according to claim 38, wherein a thickness of a portion of the insulator higher than a top surface of the pixel electrodes is 0.1 to 1μm.

45. An audio playback device according to claim 38, wherein the light emitting layer comprises an organic material.

46. An audio playback device according to claim 45, wherein the organic resin comprises a material selected from the group consisting of acrylic resin, polyimide resin, polyamide resin.

47. An audio playback device according to claim 45, wherein the organic resin comprises a resin containing a high molecular compound of siloxane.

48. An audio playback device according to claim 45, wherein a viscosity of the organic resin is $10^{-3}$ P·s to $10^{-1}$ Pa·s.

* * * * *

UNITED STATES PATENT AND TRADEMARK OFFICE
CERTIFICATE OF CORRECTION

PATENT NO. : 7,732,824 B2 Page 1 of 1
APPLICATION NO. : 11/592575
DATED : June 8, 2010
INVENTOR(S) : Toshimitsu Konuma and Junya Maruyama It is certified that error appears in the above-identified patent and that said Letters Patent is hereby corrected as shown below:

In The Specification:

In The Claims:

Column 28, Line 58, change "P·s" to -- Pa·s --.

Signed and Sealed this
Fourth Day of January, 2011

David J. Kappos
*Director of the United States Patent and Trademark Office*